United States Patent [19]
Koseko

[11] Patent Number: 5,594,891
[45] Date of Patent: Jan. 14, 1997

[54] BUS CHECKING DEVICE AND BUS CHECKING METHOD

[75] Inventor: Yasushi Koseko, Nishinomiya, Japan

[73] Assignee: Mitsubishi Denki Kabushiki Kaisha, Tokyo, Japan

[21] Appl. No.: 328,514

[22] Filed: Oct. 25, 1994

[30] Foreign Application Priority Data

Oct. 28, 1993 [JP] Japan ................................ 5-270497
Jul. 7, 1994 [JP] Japan ................................ 6-155822

[51] Int. Cl.$^6$ .......................... G06F 17/00; G06F 17/50
[52] U.S. Cl. ...................... 395/500; 371/22.1; 371/22.5; 364/488; 364/489
[58] Field of Search ........................... 395/500; 364/488, 364/489, 490, 491; 371/22.1, 22.5, 57.1, 27; 326/30, 56, 90

[56] References Cited

U.S. PATENT DOCUMENTS

| | | | |
|---|---|---|---|
| 4,654,850 | 3/1987 | Rodrigues et al. | 371/25.1 |
| 5,136,185 | 8/1992 | Fleming et al. | 326/16 |
| 5,206,584 | 4/1993 | Nishimori | 324/73.1 |
| 5,331,571 | 7/1994 | Aronoff et al. | 364/490 |
| 5,373,514 | 12/1994 | Ma | 371/57.1 |
| 5,513,188 | 4/1996 | Parker et al. | 371/22.3 |
| 5,513,190 | 4/1996 | Johnson et al. | 371/22.5 |

OTHER PUBLICATIONS

Itazaki et al., "Test Pattern Generation For Circuit With Tri-State Modules By Z-Algorithm", IEEE 1989, pp. 1327–1334.

Turino, "IEEE p.1149 Proposed Standard Testability Bus", IEEE 1988, pp. 334–337.

West, "New Advances In ECL Bus Designs", IEEE 1988, pp. 496–500.

*Primary Examiner*—Kevin J. Teska
*Assistant Examiner*—Tan Nguyen
*Attorney, Agent, or Firm*—Oblon, Spivak, McClelland, Maier & Neustadt, P.C.

[57] ABSTRACT

A bus checking device to efficiently check the exclusiveness of buses including a checked control circuit extractor (2) which extracts a control circuit portion concerned with determination of control signals according to predetermined rules using the net list (1) in which the connection relation of the designed integrated circuit is described. The exclusiveness checker (3) checks output signals of the control circuit portion extracted by the checked control circuit, extractor means (2) to examine the exclusiveness of the bus. In the exclusiveness checker (3), the information on the exclusiveness of the checked bus is stored in the bus exclusiveness information file (7a). The exclusiveness of a bus can be checked by extracting a control circuit portion concerned with generation of bus control signals in a bus control circuit and checking the control circuit portion, resulting in an improvement in the check efficiency.

20 Claims, 31 Drawing Sheets

BUS CHECKING DEVICE AND BUS CHECKING METHOD

BACKGROUND OF THE INVENTION

1. Field of the Invention

The present invention relates to a bus checking device and a bus checking method for checking for occurrence of signal conflict or floating on buses with tri-state element structure existing in logic circuits.

2. Description of the Background Art

If buses with tri-state element structure existing in a logic circuit cause signal conflict or floating, large current may flow to cause destruction or deterioration of the device.

The bus checking methods for checking for possibility of signal conflict or floating of buses include a method of checking the collision and floating by checking whether the buses are always exclusively controlled or not, that is, by checking bus signal values on the basis of results of logic simulation.

Conventionally, such a bus checking device as shown in FIG. 35 has been used for this bus checking method. In the figure, 1 denotes a net list with description of connection relation of a designed integrated circuit, 100 denotes net list input means for inputting the net list 1 for the entire integrated circuit, 104 denotes an input pattern for simulation to be applied to external input terminals of the integrated circuit, 101 denotes input pattern input means for inputting the input pattern 104 for the simulation, 102 denotes bus signal determining means for determining bus signals by performing the simulation using the input pattern inputted from the input pattern input means 101, 103 denotes signal conflict-floating deciding means for deciding signal conflict or floating using bus signals determined by the bus signal determining means and 7 denotes an exclusiveness information file of buses for storing information related to exclusiveness of the buses decided by the signal conflict-floating deciding means 103.

The procedure of the bus checking method using such a bus checking device as formed as shown in FIG. 35 will be described using the flow chart shown in FIG. 36. First, after it starts, the net list input means 100 in the bus checking device reads the net list 1 in the step S160. The read net list 1 is inputted into the bus signal determining means 102. Then in the step S161, the bus signal determining means 102 specifies buses composed of tri-state elements using the inputted net list 1.

In the step S162, the bus checking device reads all the input patterns 104 for simulation with the input pattern input means 101. The read input patterns 104 are inputted into the bus signal determining means 102 from the input pattern input means 101. Then in the step S163, the bus signal determining means 102 performs the simulation using the net list and one input pattern. Subsequently, the bus signal determining means 102 determines values of signals on the buses composed of the tri-state elements.

Next, in the step S164, the signal conflict-floating deciding means 103 finds one bus of which bus signal value is not confirmed out of the specified buses. In the step S165, the signal conflict-floating deciding means 103 makes a decision as to whether the bus signal value is 1 or 0 or not as the result of the simulation. If the bus signal value is not 1 or 0, it proceeds to the next step. If the signal conflict-floating deciding means 103 decides that 1 or 0 is outputted as a value of the bus signal as the result of the simulation in the step S165, it skips the step S166 and proceeds to the next process. In the step S166, an instance (a name) of the bus and the input pattern are displayed.

In the step S167, the signal conflict-floating deciding means 103 makes a decision as to whether signal values have been confirmed about all the specified buses. If there remain any buses which have not been confirmed yet, the signal conflict-floating deciding means 103 returns to the step S164 and repeats the operation described above. If signal values have been confirmed about all the buses, the signal conflict-floating deciding means 103 proceeds to the next step.

In the step S168, the signal conflict-floating deciding means 103 makes a decision as to whether the logic simulation has been performed about all the input patterns. If there remain input patterns which have not been executed yet, the signal conflict-floating deciding means 103 returns to the step S163 and repeats the above-described operation. The signal conflict-floating deciding means 103 ends the processing when it decides that there are no more input patterns which have not been executed.

The conventional bus checking device, which is formed as described above and checks the exclusiveness of busses according to the procedure as described above, has a problem that sufficient checks can not be made because the exclusiveness in relation to the input patterns only is checked while the bus control signals must always be exclusive.

It also has a problem that correct checks can not be accomplished because the signal conflict-floating of buses is determined on the basis of the bus signal values.

SUMMARY OF THE INVENTION

The present invention is directed to a bus checking device for checking a bus including of a tri-state element on the basis of information about a designed circuit for signal conflict or floating of the bus with control signals outputted from a bus control circuit for controlling the bus. According to the present invention, the bus checking device comprises checked control circuit extracting means for extracting a control circuit portion concerned in determination of the control signals from the information about the designed circuit according to a predetermined rule and exclusiveness checking means for checking exclusiveness of the bus by checking exclusiveness of output signals of the control circuit portion extracted by the checked control circuit extracting means.

The checked control circuit extracting means according to the invention inputs the information on the designed circuit and extracts a control circuit portion concerned in determination of control signals according to a predetermined rule. The exclusiveness checking means receives the information about the control circuit portion from the checked control circuit extracting means and checks the exclusiveness of output signals of the control circuit portion to check the exclusiveness of the bus. Accordingly, the exclusiveness of the bus can be checked only with the control circuit portion in the bus control circuit which is directly concerned in the exclusiveness of the bus by the checked control circuit extracting means and the exclusiveness checking means.

In the bus checking device, since a control circuit portion concerned in determining control signals is extracted and the exclusiveness of output signals of the control circuit portion extracted by the checked control circuit extracting means is checked to check the exclusiveness of a bus, it has the effect that efficient and accurate checks can be made as to whether signal conflict and floating occur on the bus composed of tri-state elements.

Preferably, in the bus checking device according to the present invention, the checked control circuit extracting means comprises a function of extracting a wired portion from a net list in which the information about the designed circuit is described to specify a bus with tri-state element structure, a function of tracing logic gates until reaching external input terminals and/or storage elements in a direction opposite to a flow of a signal about a control signal of the tri-state element and a function of extracting as a control circuit portion a circuit portion including the traced logic gates with the external input terminals and/or the storage elements as input terminals.

The checked control circuit extracting means according to the invention can extract logic gates and input terminals forming the control circuit portion by extracting wired portions from the net list and tracing in the direction opposite to the flow of the control signals.

In the bus checking device, since the checked control circuit extracting means extracts wired portions from the net list to specify a bus with the tri-state element structure and traces it until reaching external input terminals and/or storage elements in the direction opposite to the flow of signals about control signals of the tri-state elements, and extracts as a control circuit portion a circuit portion formed of the traced logic gates having the external input terminals and/or the storage elements as input terminals, it has the effect of easily extracting the control circuit portion.

Preferably, in the bus checking device according to the present invention, the exclusiveness checking means comprises determining means for determining a signal values of the output signals of the control circuit portion in relation to arbitrary input pattern applied to the control circuit portion, observing means for observing the signal values of the output signals determined by the determining means and deciding means for deciding exclusiveness by recognizing the number of output signals which are at a predetermined value in the signal values of the output signals.

In the exclusiveness checking means according to the invention, the determining means repeats the procedure of applying an input pattern to the control circuit portion and determining signal values of output signals, the observing means observes the signal values determined by the determining means and the deciding means recognizes the number of output signals having the predetermined value in the observed output signals to check the exclusiveness.

According to the bus checking device, it has the effect of easily forming the exclusiveness checking means by performing simulation of the control circuit portion with the determining means, the observing means and the deciding means.

Preferably, in the bus checking device according to the present invention, the exclusiveness checking means comprises determining means for obtaining output functions of the control circuit portion, observing means for selecting one signal of the output signals of the control circuit portion and performing AND operation of the output signal and NOT logics of other output signals and deciding means for performing OR operation of output results of the observing means which is repeated about all the output signals to decide exclusiveness.

According to the exclusiveness checking means of the invention, output functions of the control circuit portion are obtained by the determining means, the operation of performing the AND operation of the selected output signal and NOT logics of other output signals is repeated by the observing means and the exclusiveness can be decided by performing OR operation of the output results of the observing means by the deciding means.

The bus checking device has the effect of easily forming the exclusiveness checking means by analyzing the output functions of the control circuit portion with the determining means, the observing means and the deciding means.

Preferably, the bus checking device according to the present invention further comprises branch signal detecting means for detecting all branch signals having a plurality of signal propagation destinations using the information about the control circuit portion extracted by the checked control circuit extracting means and logic gate eliminating means for specifying logic gates which are necessary for checking the output signals of the control circuit portion from all the branch signals and eliminating other logic gates in the control circuit portion.

The branch signal detecting means of the invention detects all the branch signals which branch into a plurality of signal propagation destinations using the information related to the control circuit portion extracted by the checked control circuit extracting means. The logic gate eliminating means receives the information concerning the branch signals from the branch signal detecting means and specifies logic gates needed in testing output signals of the control circuit portion from all the branch signals. The logic gate eliminating means furthermore eliminates logic gates in the control circuit portion excepting the specified logic gates. Accordingly, waste in the test can be avoided by eliminating part not directly related to the test of exclusiveness of buses from the control circuit portion.

In the bus checking device, since all branch signals branching into a plurality of signal propagation destinations are detected in the control circuit portion extracted by the checked control circuit extracting means and logic gates unnecessary for generating output signals of the control circuit portion are eliminated in consideration of the branch signals, it has the effect that the checks for the signal conflict or floating on buses can be made more efficiently.

Preferably, in the bus checking device according to the present invention, the branch signal detecting means comprises branch signal extracting means for extracting all branch signals having a plurality of signal propagation destinations from the net list in which information about the control circuit portion is described and the logic gate eliminating means comprises downstream tracing means for tracing logic gates included in the control circuit portion toward downstream stages until reaching output signals of the control circuit portion in a flow of the branch signals extracted by the branch signal extracting means and untraced logic eliminating means for eliminating untraced logic gates which are not traced by the downstream tracing means.

The branch signal extracting means of the invention can extract branch signals from the net list. The downstream tracing means can trace to recognize logic gates to which the branch signals flow and eliminate logic gates other than the logic gates recognized by the downstream tracing means. The operation of the circuit formed of logic gates on stages preceding the branch signals can be omitted from the test for the exclusiveness check without any problem by recognizing the branch points as new input terminals of the control circuit portion.

The bus checking device can eliminate logic gates on stages prior to the branch points with the branch signal extracting means, the downstream tracing means and the untraced logic eliminating means to produce an effect that the check for signal conflict or floating of buses can be made effectively.

Preferably, the bus checking device according to the present invention further comprises bus signal determining means for determining a value of the bus signal from a signal connected to an external input fixed to a signal value of a power source or ground level and a power source or ground using the information about the designed circuit and checked bus detecting means for checking the bus signal determined by the bus signal determining means to detect a bus with tri-state structure which is not fixed to a signal at the power source or ground level as an object bus for the bus check.

The bus signal determining means of the invention determines values of bus signals from signals connected to external inputs fixed to signal values at the power source or ground level and the power source or ground using the information on the designed circuit. The checked bus detecting means checks the bus signals determined by the bus signal determining means and detects buses with tri-state structure which are not fixed to the power source or ground level signal as bus check object buses. Accordingly, control circuit portions do not have to be detected for buses having fixed values of bus signals, for example, and it is laborsaving.

According to the bus checking device of the invention, since values of bus signals are determined from signals connected to external inputs fixed to the signal values of the power source or ground level and the power source or ground, and the bus signals are checked to detect as bus check object buses the buses with tri-state structure which are not fixed to the power source or ground level signal, it has the effects that the checks of buses not to be checked can be omitted and the checks can be made in consideration of logics of the data controlled by the buses.

Preferably, the bus checking device according to the present invention further comprises register detecting means for detecting a register in the bus control circuit which operates with a free-running Clock using the information about the designed circuit and buffer replacing means for replacing the detected register with a buffer. The register detecting means according to the invention detects registers in the bus control circuit which operate with free-running clocks using the information on the designed circuit. Then the buffer replacing means replaces the registers detected by the register detecting means with buffers, therefore the bus checking device can extend the range of the check performed by the checked control circuit extracting means and the exclusiveness checking means to the stages preceding the registers in the bus control circuit.

According to the bus checking device of the invention, since registers operating with free-running clocks in the bus control circuit are detected and the registers are replaced with buffers, it has the effect that the range of checks for the signal conflict or floating of buses can be extended to enable the checks with higher preciseness.

Preferably, the bus checking device according to the present invention further comprises nested bus detecting means for detecting a nested bus from the bus control circuit using the information about the designed circuit and selector replacing means for replacing the detected nested bus with a selector of AND-OR structure.

The nested bus detecting means of the invention detects nested buses from the bus control circuit using the information on the designed circuit. Since the selector replacing means replaces the detected nested buses with selectors of AND-OR structure, the bus checking device can extend the range of check performed by the checked control circuit extracting means and the exclusiveness checking means to the stages preceding the nested buses in the bus control circuit.

According to the bus checking device of the invention, nested buses are detected from the bus control circuit and the nested buses are replaced by selectors of the AND-OR structure, so that the check ranges for the signal conflict or floating on buses can be extended to enable more accurate checks.

Preferably, the bus checking device further comprises logic circuit generating means for generating a logic circuit for preventing occurrence of signal conflict or floating in a bus for the bus which is not determined to be exclusive in the exclusiveness checking means and preventing logic circuit inserting means for inserting the logic circuit generated by the logic circuit generating means between the bus and the bus control circuit.

The logic circuit generating means in the invention generates a logic circuit for preventing occurrence of signal conflict or floating on the bus for the bus which is determined to have possibility of signal conflict or floating in the exclusiveness checking means. The preventing logic circuit inserting means inserts the logic circuit generated by the logic circuit generating means between the bus having possibility of signal conflict or floating and the bus control circuit. The inserted logic circuit can remove the possibility of signal conflict or floating on the bus.

According to the bus checking device of the invention, a logic circuit for preventing occurrence of signal conflict or floating on a bus is generated for a bus determined not to be exclusive and the generated logic circuit is inserted between the bus and the bus control circuit, therefore it has the effect that the occurrence of signal conflict and floating of buses can be efficiently prevented using necessary buses only as objects.

The present invention is also directed to a bus checking method for checking a bus including a tri-state element on the basis of information about a designed circuit for signal conflict or floating of the bus with control signals outputted from a bus control circuit for controlling the bus. According to the present invention, the bus checking method comprises a checked control circuit extracting step for extracting a control circuit portion concerned with determination of the control signals from the information about the designed circuit according to a predetermined rule and an exclusiveness checking step for checking exclusiveness of the bus by checking output signals of the control circuit portion extracted in the checked control circuit extracting step.

In the checked control circuit extracting step according to the invention, a control circuit portion concerned in determination of control signals is extracted from the information about the designed circuit according to predetermined rules. Then in the exclusiveness checking step, the exclusiveness of the bus is checked by checking output signals of the control circuit portion extracted in the checked control circuit extracting step. Accordingly, the exclusiveness of the bus can be checked only with the control circuit portion in the bus control circuit which is directly concerned with the exclusiveness of the bus.

In the bus checking method, since a control circuit portion concerned in determining control signals is extracted and output signals of that control circuit portion are checked to check the exclusiveness of the bus, it has the effect that efficient and accurate checks can be made as to whether signal conflict and floating occur or not on buses composed of tri-state elements.

Preferably, in the bus checking method according to the present invention, the checked control circuit extracting Step comprises a step of extracting a wired portion from a net list in which the information about the designed circuit is described to specify a bus with tri-state element structure, a step of tracing logic gates until reaching external input terminals and/or storage elements in a direction opposite to a flow of a signal about a control signal of the tri-state element and a step of extracting as a control circuit portion a circuit portion including the traced logic gates with the external input terminals and/or the storage elements as input terminals.

In the checked control circuit extracting step according to the invention, logic gates and input terminals forming the control circuit portion can be extracted by extracting wired portions from the net list and tracing in the direction opposite to the flow of control signals.

According to the bus checking method of the invention, since wired portions are extracted from the net list in the checked control circuit extracting step to specify buses with the tri-state element structure, and they are traced until reaching external input terminals and/or storage elements in the direction opposite to the flow of the signals about control signals of the tri-state elements, and a circuit portion formed of the traced logic gates with the external input terminals and the storage circuit portions as input terminals is extracted as a control circuit portion, it has the effect of easily extracting the control circuit portion.

Preferably, in the bus checking method according to the present invention, the exclusiveness checking step comprises a determining step for determining signal values of output signals of the control circuit portion in relation to arbitrary input pattern applied to the control circuit portion, an observing step for observing the signal values of the output signals determined by the determining step and a deciding step for deciding exclusiveness by recognizing the number of output signals which are at a predetermined value in the signal values of the output signals.

In the exclusiveness checking step according to the invention, the operation of applying the input pattern to the control circuit portion and determining signal values of output signals is repeated by the determining step, the signal values determined by the determining step is observed by the observing step, and the number of the output signals having a predetermined value in the observed output signals is recognized by the deciding step to check the exclusiveness.

According to the bus checking method of this invention, it has the effect of easily making the exclusiveness checking step by performing simulation of the control circuit portion in the determining step, the observing step and the deciding step.

Preferably, in the bus checking method according to the present invention, the exclusiveness checking step comprises a determining step for obtaining output functions of the control circuit portion, an observing step for selecting one signal of the output signals of the control circuit portion and performing AND operation of the output signal and NOT logics of other output signals and a deciding step for performing OR operation of output results of the observing step which are repeated about all the output signals to decide exclusiveness.

In the exclusiveness checking step of the invention, output functions of the control circuit portion is obtained by the determining step, the operation of performing the AND operation of the selected output signal and NOT logics of other output signals is repeated by the observing step and the exclusiveness is decided by performing the OR operation of the output results of the observing step by the deciding step.

The bus checking method of this invention has the effect of easily forming the exclusiveness checking step by analyzing the output functions of the control circuit portion in the determining step, the observing step and the deciding step.

Preferably, the bus checking method according to the present invention further comprises a branch signal detecting step for detecting all branch signals having a plurality of signal propagation destinations using the information about the control circuit portion extracted by the checked control circuit extracting step and a logic gate eliminating step for specifying logic gates which are necessary for checking the output signals of the control circuit portion from signals passing through all the branch signals and eliminating other logic gates of the control circuit portion.

In the branch signal detecting step of the invention, all branch signals which branch into a plurality of signal propagation destinations are detected on the basis of the information related to the control circuit portion extracted in the checked control circuit extracting step. In the logic gate eliminating step, logic gates needed in testing output signals of the control circuit portion are specified from all the detected branch signals. Furthermore, logic gates in the control circuit portion excepting the specified logic gates are eliminated in the logic gate eliminating step. Accordingly, waste in the test can be avoided by eliminating part not directly related to the test of exclusiveness of the bus from the control circuit portion.

According to the bus checking method of this invention, since all the branch signals branching into a plurality of signal propagation destinations are detected on the basis of the information related to the control circuit portion and logic gates unnecessary for generating output signals of the control circuit portion are eliminated in consideration of the branch signals, it has the effect that the checks for the signal conflict or floating on buses can be made more efficiently.

Preferably, in the bus checking method according to the present invention, the branch signal detecting step comprises a branch signal extracting step for extracting all branch signals having a plurality of propagation destinations of signal from a net list in which the information about the control circuit portion is described and the logic gate eliminating step comprises a downstream tracing step for tracing the logic gates included in the control circuit portion toward downstream stages until reaching output signals of the control circuit portion in a flow of the branch signals extracted by the branch signal extracting step and untraced logic eliminating step for eliminating untraced logic gates which are not traced by the downstream tracing step.

In the branch signal extracting step of the invention, branch signals are extracted from the net list. In the downstream tracing step, logic gates through which the branch signals flow are recognized by tracing and logic gates other than the logic gates recognized by the downstream tracing step are removed. The operation of the circuit formed of logic gates on stages preceding the branch signals can be omitted from the test for the exclusiveness check without causing any problem by recognizing the branch points as new input terminals of the control circuit portion.

According to the bus checking method of this invention, logic gates on stages prior to branch points can be eliminated by the branch signal extracting step, the downstream tracing step and the untraced logic eliminating step to produce an effect that the checks for the signal conflict or floating of buses can be achieved effectively.

Preferably, the bus checking method according to the present invention further comprises, before the checked control circuit extracting step, a bus signal determining step for determining a value of the bus signal from a signal connected to an external input fixed to a signal value of a power source or ground level and a power source or ground using the information about the designed circuit and a bus detecting step for detecting a bus with the tri-state element which is not fixed to a signal at the power source or ground level as an object bus for the bus check using the value of the bus signal determined in the bus signal determining step.

In the bus signal determining step of the invention, values of bus signals are determined from signals connected to external inputs fixed to the signal values at the power source or ground level and the power source or ground using the information on the designed circuit. In the bus signal detecting step, buses including tri-state elements which are not fixed to the power source or ground level signals are detected as bus check object buses from the determined values of the bus signals. Accordingly, control circuit portions do not have to be detected about buses with fixed values of bus signals in the checked control circuit extracting step, for example, and it is laborsaving.

According to the bus checking method of the invention, since values of the bus signals are determined from signals connected to external inputs fixed to the signal value of the power source or ground level and the power source or ground and the buses including tri-state elements which are not fixed to the power source or ground level signal are detected as bus check object buses using the determined values of the bus signals, it has effects that the checks of buses not to be checked can be omitted and the checks can be made in consideration of logics of the data controlled by the buses.

Preferably, the bus checking method according to the present invention further comprises, before the checked control circuit extracting step, a register detecting step for detecting a register in the bus control circuit which operates with a free-running clock using the information about the designed circuit and a buffer replacing step for replacing the detected register with a buffer.

In the register detecting step according to the invention, registers which operate with free-running clocks are detected from the bus control circuit using the information on the designed circuit. The detected registers are replaced by buffers in the buffer replacing step, therefore the area of the check performed in the checked control circuit extracting step and the exclusiveness checking step can be extended to the previous stage to the registers in the bus control circuit.

According to the bus checking method of the invention, registers operating with free-running clocks in the bus control circuit can be detected and the detected registers are replaced with buffers, therefore it has the effect that the check range for the signal conflict or floating of buses can be extended to enable checks with higher preciseness.

Preferably, the bus checking method according to the present invention further comprises, before the checked control circuit extracting step, a nested bus detecting step for detecting a nested bus in the bus control circuit using the information about the designed circuit and a selector replacing step for replacing the detected nested bus with a selector of AND-OR structure.

In the nested bus detecting step of the invention, nested buses in the bus control circuit are detected using the information on the designed circuit. Since the detected nested buses are replaced with selectors of AND-OR structure in the selector replacing step, the range of check performed by the checked control circuit extracting step and the exclusiveness checking step can be extended to the previous stage to the nested buses in the bus control circuit.

According to the bus checking method of the invention, nested buses are detected from the bus control circuit and the nested buses are replaced by selectors of the AND-OR structure, so that the check range of the signal conflict or floating of buses can be extended to enable checks with higher preciseness.

Preferably, the bus checking method further comprises, after the exclusiveness checking step, a step for generating a logic circuit for preventing occurrence of signal conflict or floating in a bus for the bus which is not determined to be exclusive in the exclusiveness checking step and a preventing logic circuit inserting step for inserting the generated logic circuit between the bus and the bus control circuit.

In the logic circuit generating step of the invention, a logic circuit for preventing occurrence of signal conflict or floating on a bus is generated for the bus which is determined to have possibility of signal conflict or floating. The generated logic circuit is inserted between the bus and the bus control circuit in the preventing circuit inserting step. The inserted logic circuit can remove the possibility of signal conflict or floating on the bus.

According to the bus checking method of the invention, a logic circuit for preventing occurrence of the signal conflict or floating on a bus is generated for the bus determined not to be exclusive and the generated logic circuit is inserted between the bus and the bus control circuit, therefore it has the effect that the occurrence of the signal conflict and floating on buses can be efficiently prevented using only necessary buses as objects.

Accordingly, it is an object of the present invention to obtain a bus checking device and a bus checking method which can sufficiently and efficiently check that signal conflict or floating dose not occur on buses by making checks of the exclusiveness with outputs of combinational circuit portions (or parts which can be regarded as combinational circuits) as objects.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
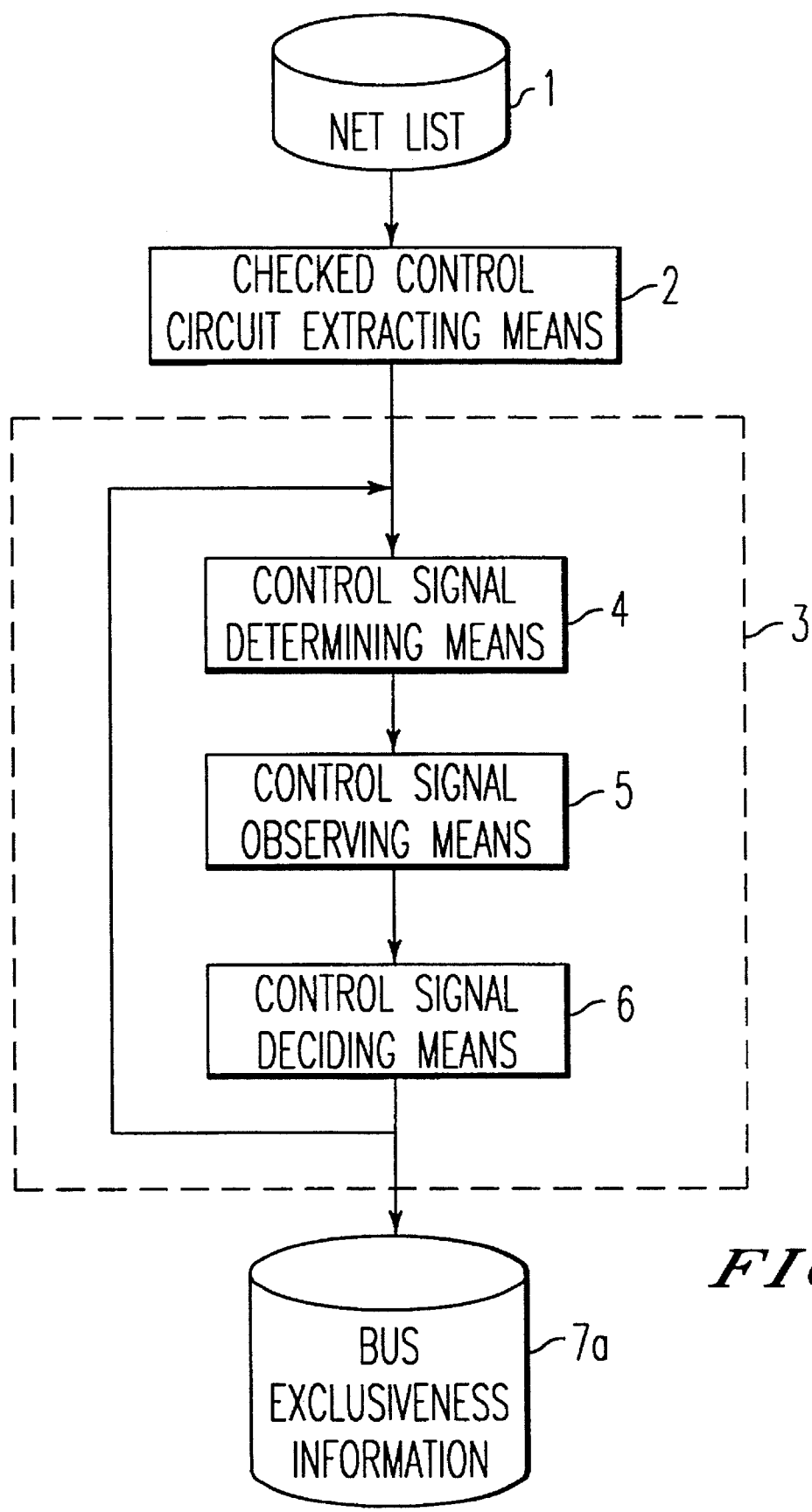
FIG. 1 is a block diagram showing the structure of a bus checking device according to the first preferred embodiment of the present invention.

A bus checking device according to the first preferred embodiment of the present invention will be described below referring to FIG. 1 and FIG. 2. FIG. 1 is a block diagram showing the bus checking device according to the first preferred embodiment of the present invention. In FIG. 1, 1 denotes a net list in which the connection relation of a designed integrated circuit is described, 2 denotes checked control circuit extracting means for extracting a control circuit portion which is concerned with determination of control signals from the net list 1 according to predetermined rules, 3 denotes exclusiveness checking means for checking exclusiveness of bus by checking output signals of the control circuit portion extracted by the checked control circuit extracting means 2, and 7a denotes a bus exclusiveness information file for storing information on the exclusiveness of buses checked by the exclusiveness checking means 3.

Now, the control circuit portion is a circuit portion which directly supplies bus control signals to control terminals of tri-state elements, and which is a circuit specified for the bus exclusiveness check in the bus control circuit.

To extract the control circuit portion, the checked control circuit extracting means 2 described above has a function of extracting buses with the tri-state element structure from the net list, for example. Furthermore, the checked control circuit extracting means 2 has a function of tracing until reaching external input terminals and/or storage elements such as registers and extracting the traced circuits as control circuit portions to be objects of the check.

The exclusiveness checking means 3 for checking the exclusiveness of buses includes control signal determining means 4, control signal observing means 5 and control signal deciding means 6. The control signal determining means 4 performs simulation of the extracted control circuit or obtains output functions to determine output signals of the control circuit. The control signal observing means 5 observes values of the output signals determined by the control signal determining means. The control signal deciding means 6 decides whether the control signals observed by the control signal observing means are exclusive or not.

Figure 2:
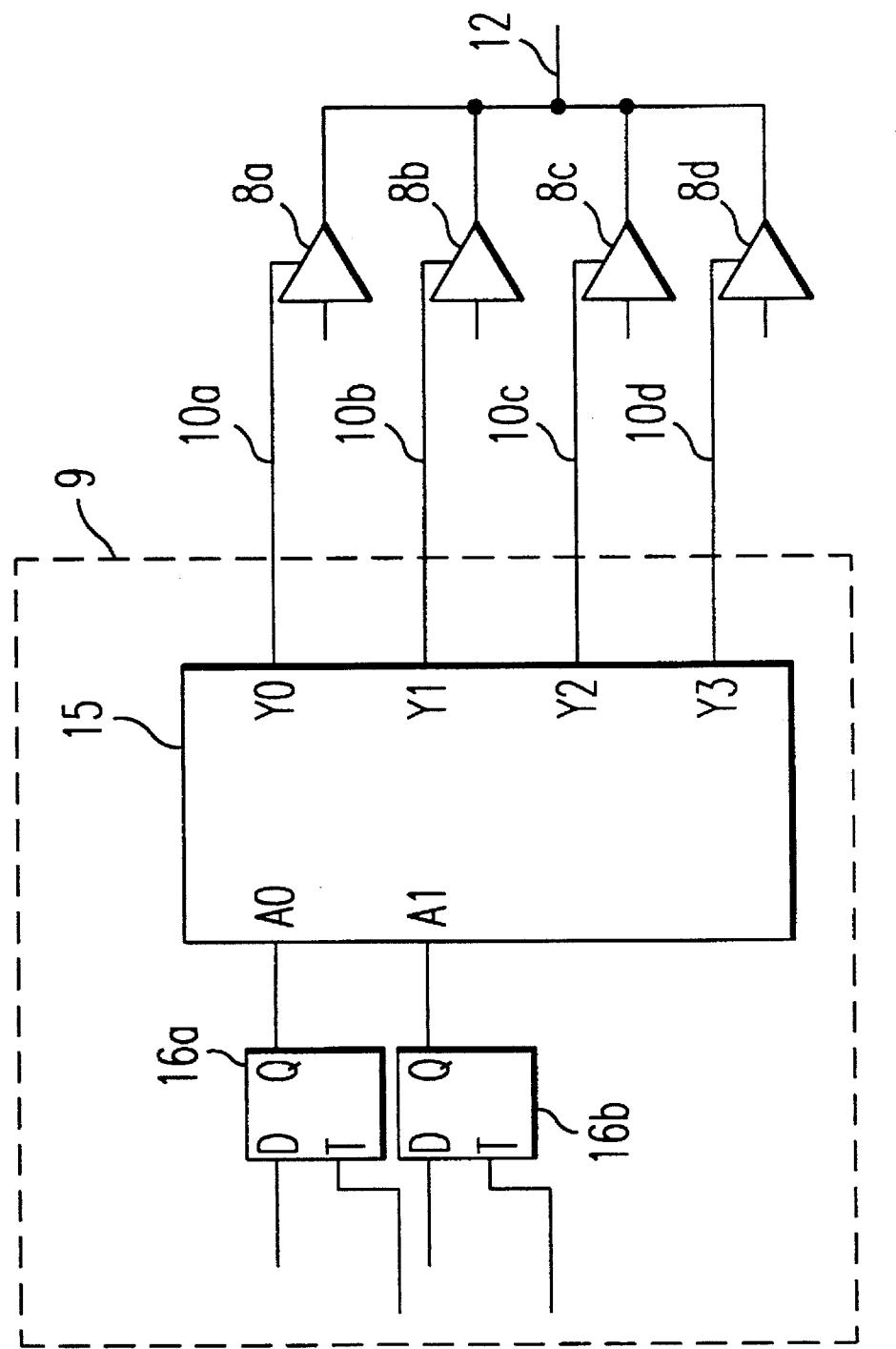
FIG. 2 is a logic diagram showing one example of a circuit which is an object of processing by the bus checking device according to the first preferred embodiment of the present invention.

Next, using FIG. 2, the operation of the bus checking device shown in FIG. 1 will described. For example, if such a circuit as shown in FIG. 2 is described in the net list 1, the checked control circuit extracting means 2 detects a bus signal line 12 to which a plurality of tri-state elements 8a–8d are connected. Then, the checked control circuit extracting means 2 traces control signals 10a–10d of the tri-state elements 8a–8d in the direction opposite to the signal flow. In the case of such a circuit as shown in FIG. 2, the checked control circuit extracting means 2 traces until registers 16a and 16b are reached. The checked control circuit extracting means 2 then extracts a traced decoder 15 as a control circuit portion which is an object of the check in a bus control circuit 9. The exclusiveness checking means 3 checks the exclusiveness of the bus using simulation as described below, for example.

First, the control signal determining means 4 applies a set of input patterns to inputs A0 and A1 of the decoder 15. Then it effects simulation to determine signal values of outputs Y0–Y3 which correspond to the input patterns. The control signal observing means 5 receives the signal values of the outputs Y0–Y3 from the control signal determining means 4 and counts the number of signals which take 1 as output signal values. The control signal deciding means 6 receives the number of signals having the signal value of 1 from the control signal observing means 5 and decides whether the number is 1 or not. If the number of signals having the signal value of 1 is 1, the exclusiveness of the bus is secured, therefore the control signal deciding means 6 provides a signal to the control signal determining means 4 so that a determination of exclusiveness of the bus is made using new input pattern. If the number of signals having a signal value 1 is not 1, it can be decided that the exclusiveness of the bus is not secured, so that the control signal deciding means 6 outputs an instance of the bus and the input pattern to the file 7a for storing the exclusiveness information of buses and also applies a signal to the control signal determining means 4 to make a determination of the exclusiveness of the bus using new input pattern.

When the exclusiveness checking means 3 checks the exclusiveness of the bus using output functions, the procedure proceeds as described below, for example.

First, the control signal determining means 4 obtains output functions of the decoder 15. The control signal observing means 5 selects one of the outputs Y0–Y3. For example, if the output Y0 is selected, the control signal observing means 5 performs AND operation of the output Y0 and NOT logics of the outputs Y1–Y3. It performs the logic operation also when the outputs Y1–Y3 are selected, and outputs the results thereof to the control signal deciding means 6. The control signal deciding means 6 operates OR of outputs from the control signal observing means 5. If the result of the operation is 1, as the exclusiveness of the bus is secured, the control signal deciding means 6 applies a signal to the control signal determining means 4 so that a check for the exclusiveness of another bus should be made. If the operation result is not 1, as it can be decided that the exclusiveness of the bus is not ensured, the control signal deciding means 6 outputs the instance of the bus to the file 7a for storing the bus exclusiveness information and also applies a signal to the control signal determining means 4 so that a check on the exclusiveness of a bus should be made about another bus.

Figure 7:
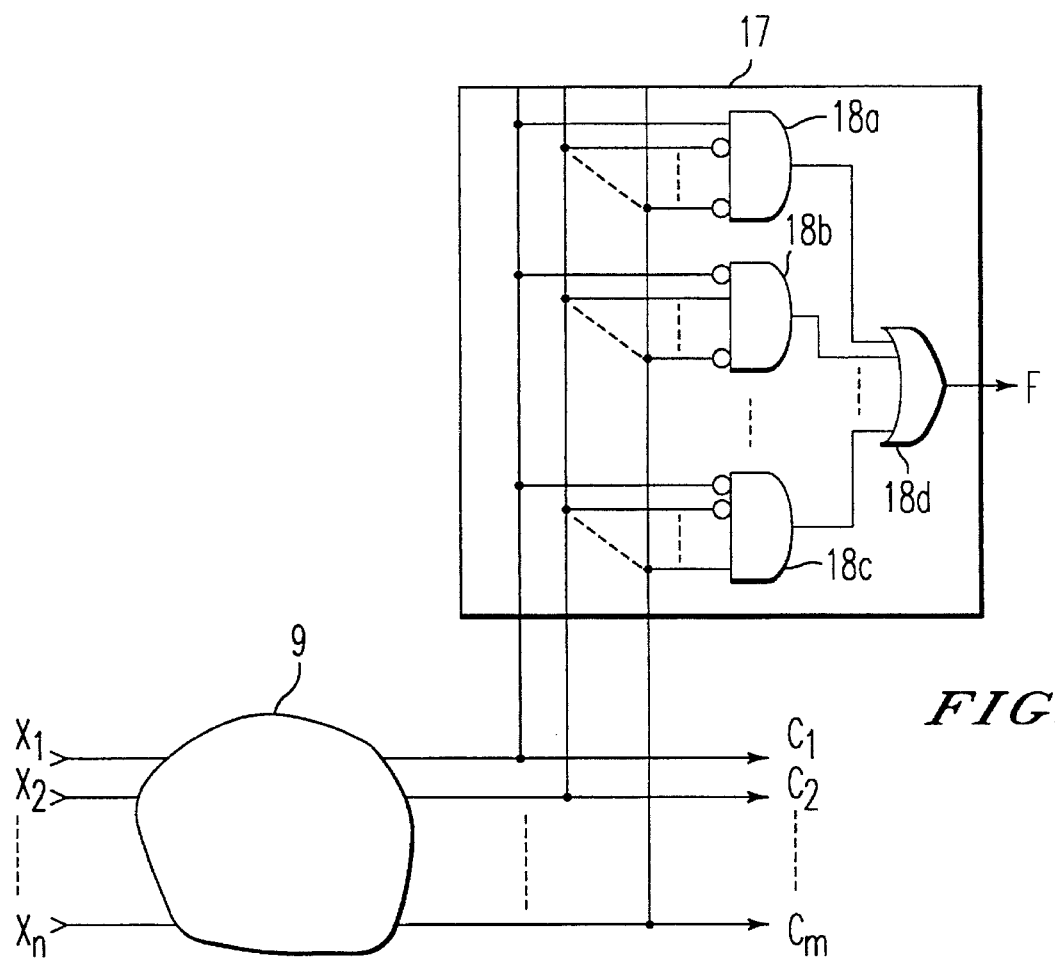
FIG. 7 is a logic diagram for describing the operation of the bus checking device according to the first preferred embodiment of the present invention.

The exclusiveness checking means 3 when the exclusiveness of control signals of tri-state elements is checked with the output functions will be described using FIG. 7. A control circuit portion in the bus control circuit 9 is extracted by the checked control circuit extracting means 2. Outputs of the extracted control circuit portion are the same as outputs $C_1$–$C_m$ of the bus control circuit 9. The exclusiveness checking means 3 connects the outputs $C_1$–$C_m$ to a testing logic circuit 17 and detects an output F of the testing logic circuit 17 to decide the exclusiveness of the bus control signals. That is to say, it is recognized that the outputs of the bus control circuit 9 are exclusive when the value of the output F is 1, and they may not be exclusive when the value of the output F is not 1.

The testing logic circuit 17 includes a plurality of AND gates such as 18a–18c and an OR gate 18d for operating logics of outputs of the AND gates 18a–18c and the like. The AND gate 18a performs AND operation of the output $C_1$ and NOT logics of the outputs $C_2$–$C_m$. The AND gate 18b performs AND operation of the output $C_2$ and NOT logic of $C_1$ and NOT logics of the outputs $C_3$–$C_m$. The AND gate 18c performs AND operation of the output $C_m$ and NOT logics of the outputs $C_1$–$C_{m-1}$. AND gates, for performing AND operation of the output $C_3$ and NOT logics of other outputs, for example, are not shown in the figure.

Conventionally, the entire integrated circuit has been used as an object of the check. The bus checking device according to the present invention, however, can check the exclusiveness of a bus only with a control portion in a bus control circuit as an object, which enables an improvement in the efficiency of the bus check.

Next, the procedure for realizing the above-described bus checking device using a computer will be described.

Figure 3:
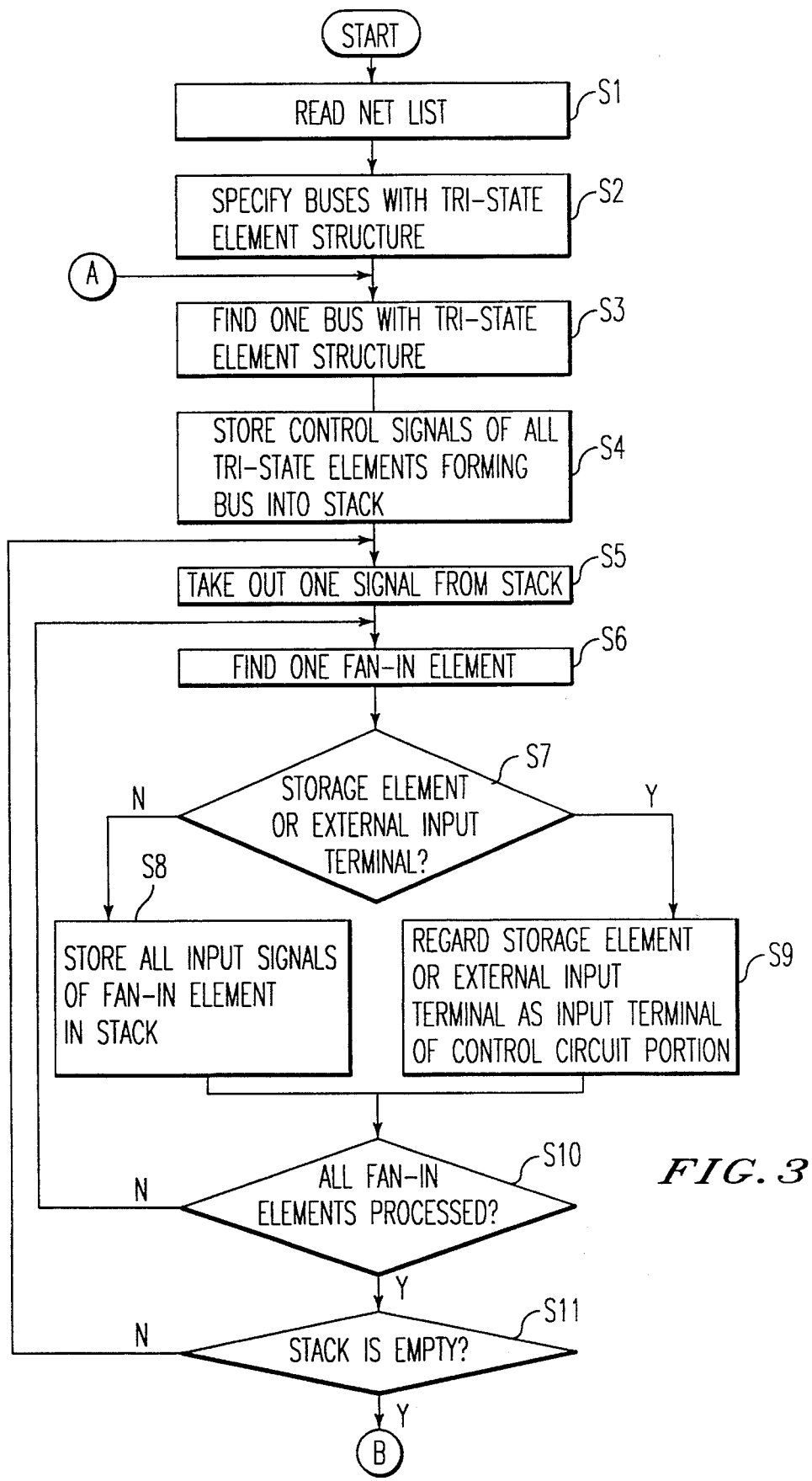
FIG. 3 is a flow chart showing one example of the procedure for realizing the bus checking method according to the first preferred embodiment of the present invention with a computer.
Figure 4:
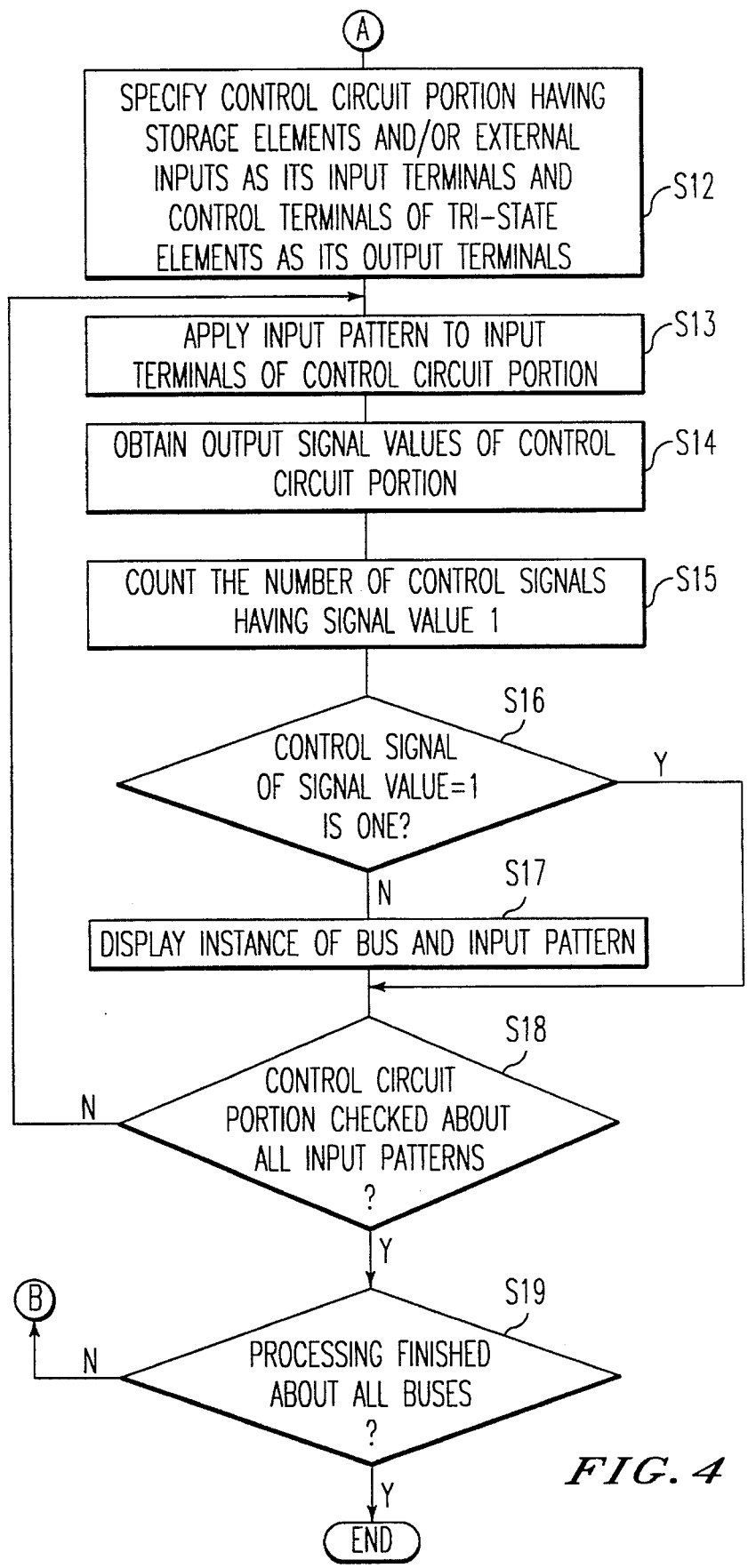
FIG. 4 is a flow chart showing one example of the procedure for realizing the bus checking method according to the first preferred embodiment of the present invention with a computer.

First, the check of exclusiveness of buses by simulation will be described referring to FIG. 3 and FIG. 4. When it starts, the net list is read in the step S1. Next, in the step S2, buses with the tri-state element structure are determined using the net list. Generally, buses with the tri-state element structure can easily be specified from the net list since wired portions can be known from the net list and outputs of tri-state elements are connected to the wired portions.

In the step S3, one bus which has not be checked for the exclusiveness is extracted out of the specified buses with the tri-state element structure. In the step S4, control signals of all the tri-state elements forming the bus extracted in the step S3 are stored in the stack. In the step S5, one stored signal is taken out from the stack storing the control signals of the tri-state elements in the step S4. In the step S6, one fan-in element connected to this control signal is found. In the step S7, a determination is made as to whether the fan-in element found in the step S6 is a storage element or an external input terminal or not, and if it is a storage element or an external input terminal, it proceeds to the step S8, and if it is not a storage element or an external input terminal, it proceeds to the step S9.

In the step S8, the storage element or external input terminal connected to this signal is defined as an input terminal of the control circuit portion, and it proceeds to the step S10. In the step S9, all input signals of the fan-in element are stored in the stack in which the control signals are stored in the step S4, and it proceeds to the step S10.

In the step S10, a determination is made as to whether the processes to the step S10 have been finished about all the fan-in elements connected to the signal taken out in the step S5 or not. If the processes have been finished about all of the fan-in elements, it proceeds to the step S11 from the step S10, and if there remain elements which have not been processed yet, it proceeds to the step S6 from the step S10.

In the step S11, a determination is made as to whether the stack storing the control signals in the step S4 is empty or not. If the stack is empty, it proceeds to the step S12 from the step S11, and if the stack is not empty, it proceeds to the step S5 from the step S11.

In the step S12, a control circuit portion having storage elements and/or external input terminals as input terminals and control terminals of tri-state elements as output terminals is specified. In the step S13, input pattern to be inputted to the control circuit portion is generated, which is applied to the input terminals of the control circuit portion specified in the step S12. In the step S14, output signal values of the control circuit portion for the input pattern applied in the step S13 are obtained. In the step S15, the number of output signals having the signal value of 1 is counted in the signal values of the output signals obtained in the step S14. In the step S16, a determination is made as to whether the number of control signals having the signal value 1 counted in the step S15 is 1 or not. If the number of such control signals is 1, it proceeds to the step S18 from the step S16, and if the number of such control signals is not 1, it proceeds to the step S17 from the step S16. In the step S17, an instance of the bus and the input pattern are displayed, and it goes to the step S18.

In the step S18, a determination is made as to whether the control circuit portion has been checked about all the input patterns to be applied to the control portion or not. If there remain any unchecked input patterns, it proceeds to the step S13 from the step S18, and if the check has been finished about all the input patterns to be simulated, it proceeds to the next step from the step S18.

In the step S19, a determination is made as to whether the processing has been finished about all the buses specified in the step S2 or not. If any bus has not been subjected to the check, it proceeds to the step S3 from the step S19, and if all the buses to be checked have been already checked, all the processes are ended.

Figure 5:
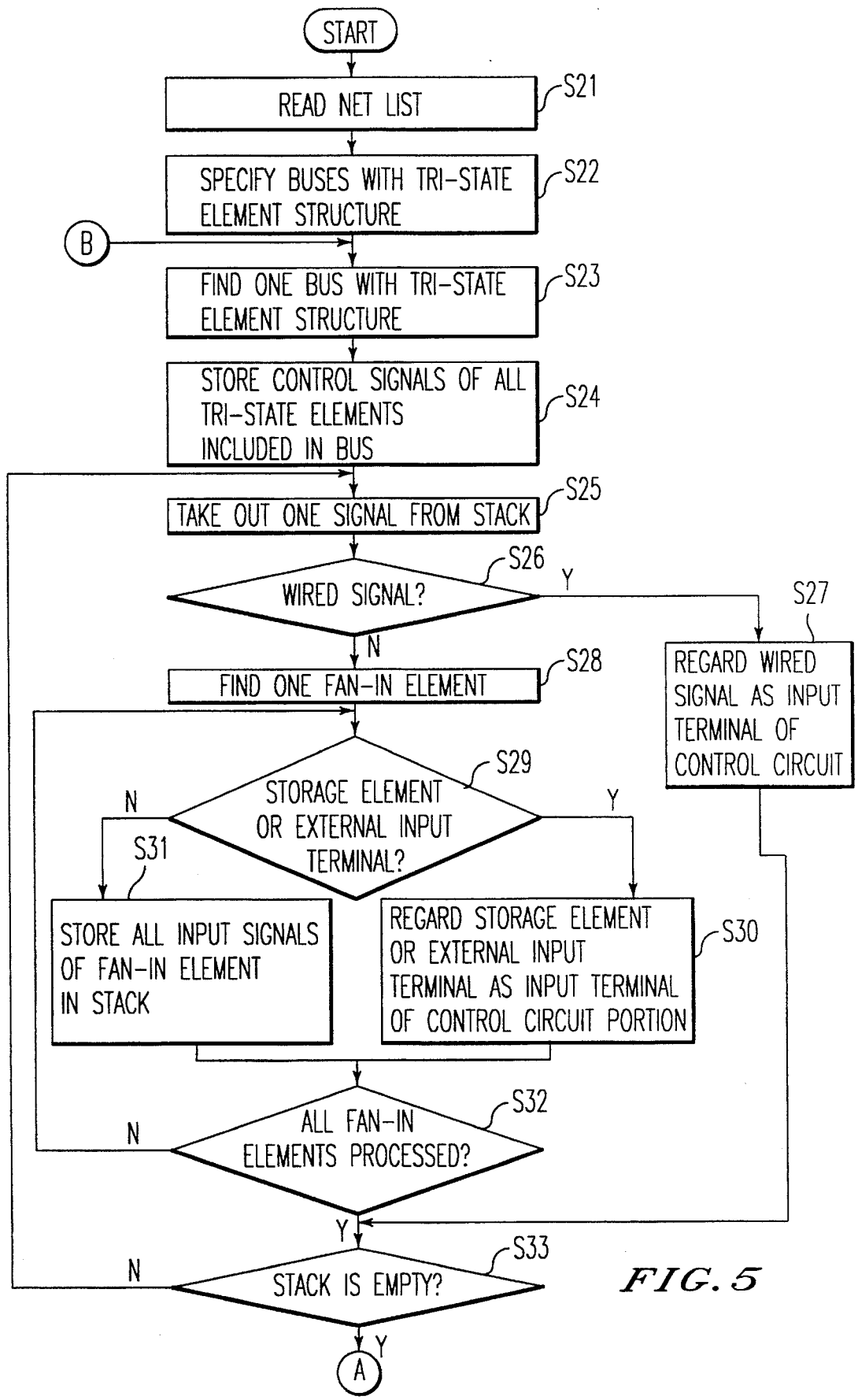
FIG. 5 is a flow chart showing another example of the procedure for realizing the bus checking method according to the first preferred embodiment of the present invention with a computer.
Figure 6:
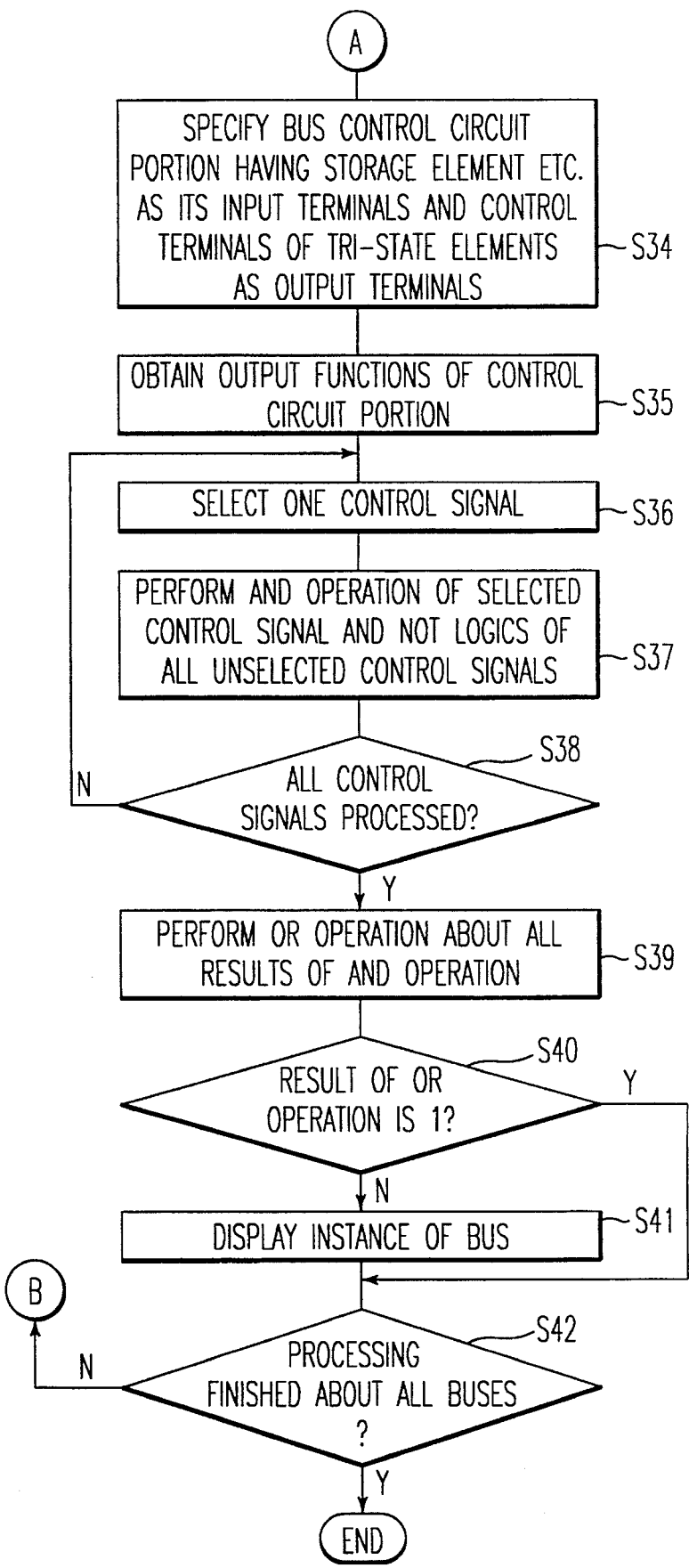
FIG. 6 is a flow chart showing another example of the procedure for realizing the bus checking method according to the first preferred embodiment of the present invention with a computer.

Next, the case of checking the exclusiveness of buses with output functions will be described referring to FIG. 5 and FIG. 6.

When it starts, first in the step S21, the net list is read. Next, in the step S22, buses with the tri-state element structure are specified using the net list read in the previous step.

In the step S23, only one of the buses with the tri-state element structure specified in the previous step which has not checked for the exclusiveness is extracted. In the step S24, control signals of all the tri-state elements forming the bus extracted in the step S23 are stored in a stack. In the step S25, one stored signal is taken out from the stack storing the control signals of the tri-state elements in the step S24.

In the step S26, a determination is made as to whether the signal taken out in the previous step is a wired signal or not. If this signal is a wired signal, it proceeds to the step S27 from the step S26. If this signal is not a wired signal, it proceeds to the step S28 from the step S26. Then in the step S27, this wired signal is defined as an input terminal of the control circuit portion. Now, the wired signal means a signal which is obtained by mutually connecting outputs of a plurality of gates.

In the step S28, one fan-in element connected to this control signal is found. In the step S29, a determination is made as to whether the fan-in element found in the step S28 is a storage element or an external input terminal or not, and if it is not a storage element or an external input terminal, it goes to the step S31, and if it is a storage element or an external input terminal, it goes to the step S30.

In the step S31, all the input signals of the fan-in element are stored in the stack storing the control signals in the step S24, and the flow goes to the step S32. In the step S30, the storage element or the external input terminal connected to this signal is defined as an input terminal of the control circuit portion and it proceeds to the step S32.

In the step S32, a determination is made as to whether the processes to the step S32 have been finished about all the fan-in elements connected to the signal taken out in the step S25 or not. If the processes have been finished about all the fan-in elements, it proceeds to the step S33 from the step S32, and if the processes have not been finished about any element, it proceeds to the step S28 from the step S32.

In the step S33, a determination is made as to whether the stack storing the control signals in the step S24 is empty or not. If the stack is empty, the flow proceeds to the step S34 from the step S33, and if the stack is not empty, it proceeds to the step S25 from the step S33.

In the step S34, a control circuit portion having storage elements or external input terminals or wired signals as its input terminals and control terminals of tri-state elements as its output terminals is specified. In the step S35, output functions of the control circuit portion specified in the step S34 is obtained. In the step S36, one output signal of the control circuit portion specified in the step S34 is selected. In the step S37, AND operation is performed about the control signal selected in the step S36 and NOT logics of all other control signals which are not selected. In the step S38, a determination is made as to whether all the control signals of the control circuit portion specified in the step S34 are selected and operated or not. If all the control signals have been processed, it proceeds to the step S39 from the step S38, and if any control signal remains unprocessed, it proceeds to the step S36 from the step S38.

In the step S39, OR operation is performed about all of the results of the AND operations made in the step S37. Then in the step S40, a determination is made as to whether the result of the OR operation made in the step S39 is 1 or not. If the result of the OR operation is 1, it proceeds to the step S42 from the step S40. If the result of the OR operation is not 1, it moves to the step S41 from the step S40, and in the step S41, an instance of the bus is displayed and then it proceeds to the step S42.

In the step S42, a determination is made as to whether the processes have been finished about all the buses specified in the step S22 or not. If any bus is not checked yet, the flow proceeds to the step S23 from the step S42, and if all the buses to be checked have already been checked, all the processes are ended.

Second Preferred Embodiment

Figure 8:
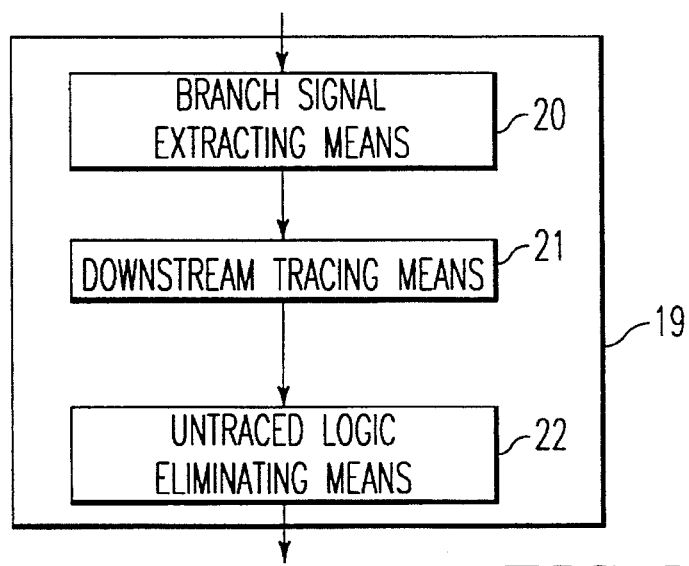
FIG. 8 is a block diagram showing the structure of the control circuit eliminating means of the bus checking device according to the second preferred embodiment of the present invention.

Next, the second preferred embodiment of the present invention will be described using FIG. 8 through FIG. 10. FIG. 8 is a block diagram showing the structure of control circuit eliminating means according to the second preferred embodiment of the present invention. In the figure, 19 denotes control circuit eliminating means for eliminating parts which are not necessary in determining the exclusiveness of outputs from a combinational circuit, 20 denotes branch signal extracting means for extracting branch signals from the combinational circuit, 21 denotes downstream tracing means for tracing the flow of branch signals extracted by the branch signal extracting means 20 toward downstream stages in the combinational circuit until reaching outputs of the combinational circuit and 22 denotes untraced logic eliminating means for eliminating logic gates in the combinational circuit which are not traced by the downstream tracing means 21.

The control circuit eliminating means 19 is inserted between the checked control circuit extracting means 2 and the exclusiveness checking means 3 of the bus checking device described in the first preferred embodiment. The control circuit eliminating means 19 eliminates parts unnecessary in determining the exclusiveness of control signals which control tri-state elements forming a bus from a combinational circuit in a control circuit portion extracted by the checked control circuit extracting means 2.

The operation of the control circuit eliminating means 19 will be described referring to FIG. 9 and FIG. 10. FIG. 9 is a logic diagram of a control circuit portion extracted from inside a bus control circuit, which includes AND gates, OR gates and an inverter. FIG. 10 is a logic diagram of an exclusiveness check object circuit after processed by the control circuit eliminating means 19. In FIG. 9 and FIG. 10, 23 and 24 denote bus control signal lines, 25, 26 and 27 denote AND gates, 28 and 29 denote OR gates, 30 denotes an inverter and 31 and 32 denote branch points.

Figure 9:
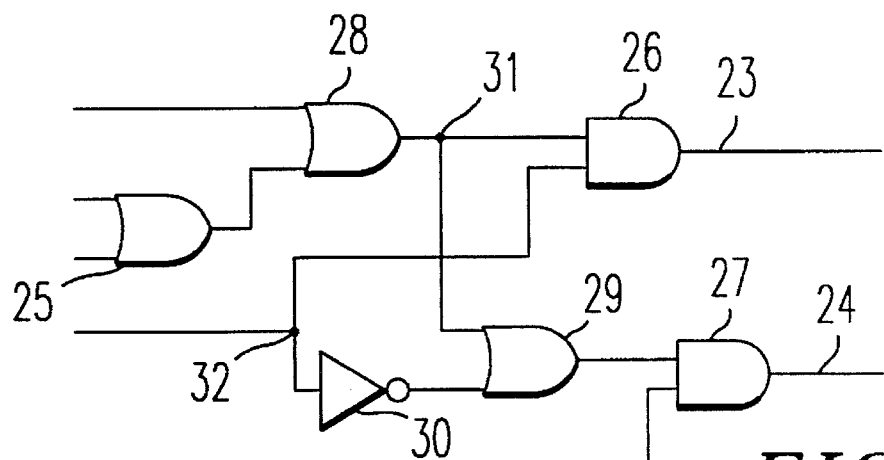
FIG. 9 is a logic diagram showing one example of a circuit which is an object of processing by the bus checking device according to the second preferred embodiment of the present invention.
Figure 10:
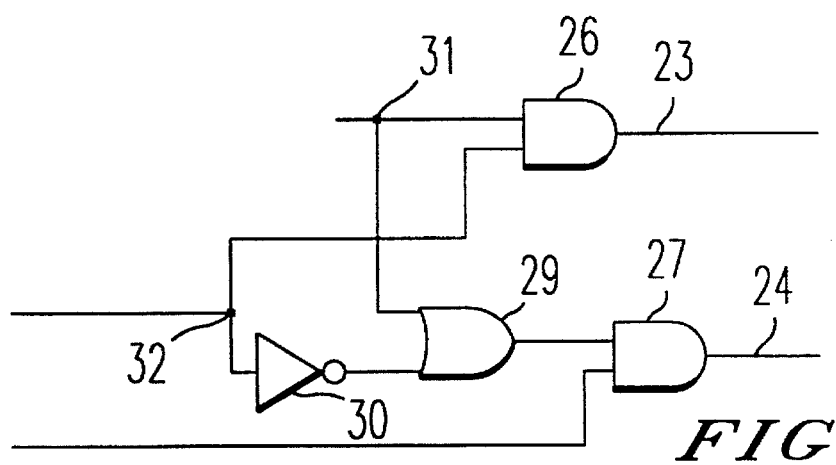
FIG. 10 is a logic diagram showing a circuit obtained after the bus checking device according to the second preferred embodiment has processed the circuit in FIG. 9.

The checked control circuit extracting means 2 similar to that shown in FIG. 1 extracts a control circuit portion from a bus control circuit, and such a control circuit portion as shown in FIG. 9 is obtained as a result. The control circuit eliminating means 19 detects the branch points 31 and 32 using the branch signal detecting means 20. The control signal eliminating means 19 traces in the forward direction from the branch points 31 and 32 with the downstream tracing means 21. After the downstream tracing, the control circuit eliminating means 19 eliminates the untraced logic gates 25 and 28 with the untraced logic eliminating means. The circuit shown in FIG. 10 is obtained, which is regarded as an object of the exclusiveness check by the exclusiveness checking means 3 similar to that shown in FIG. 1. Because the area of the control circuit portion as an object of the exclusiveness check becomes smaller, the efficiency in the bus check can be enhanced.

Now, when using simulation in conducting the exclusiveness check, fan-in elements at wired portions may be included in the area of a control circuit portion which is an object of the exclusiveness check.

Figure 11:
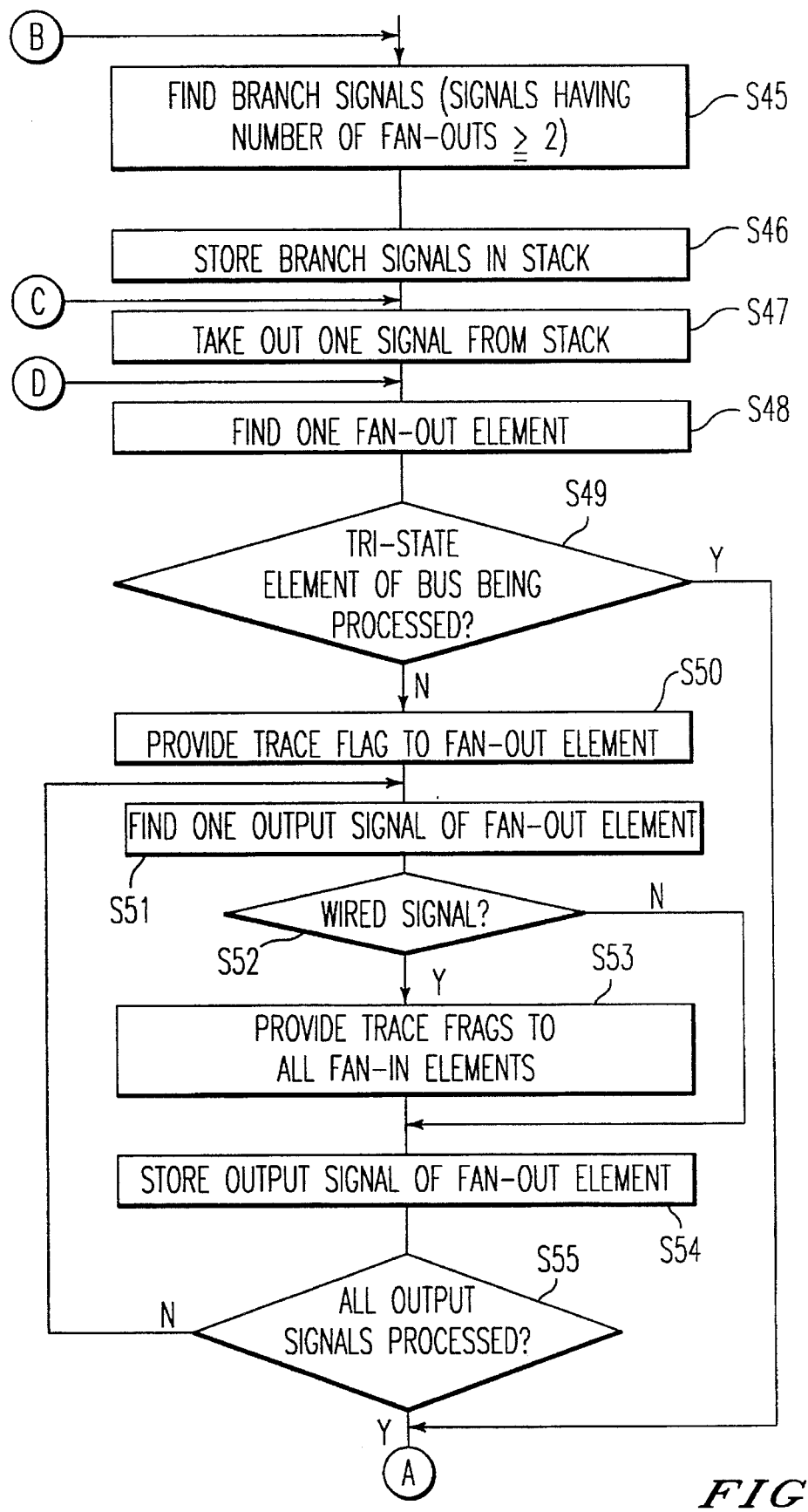
FIG. 11 is a flow chart showing one example of the procedure for realizing the bus checking method according to the second preferred embodiment of the present invention with a computer.
Figure 12:
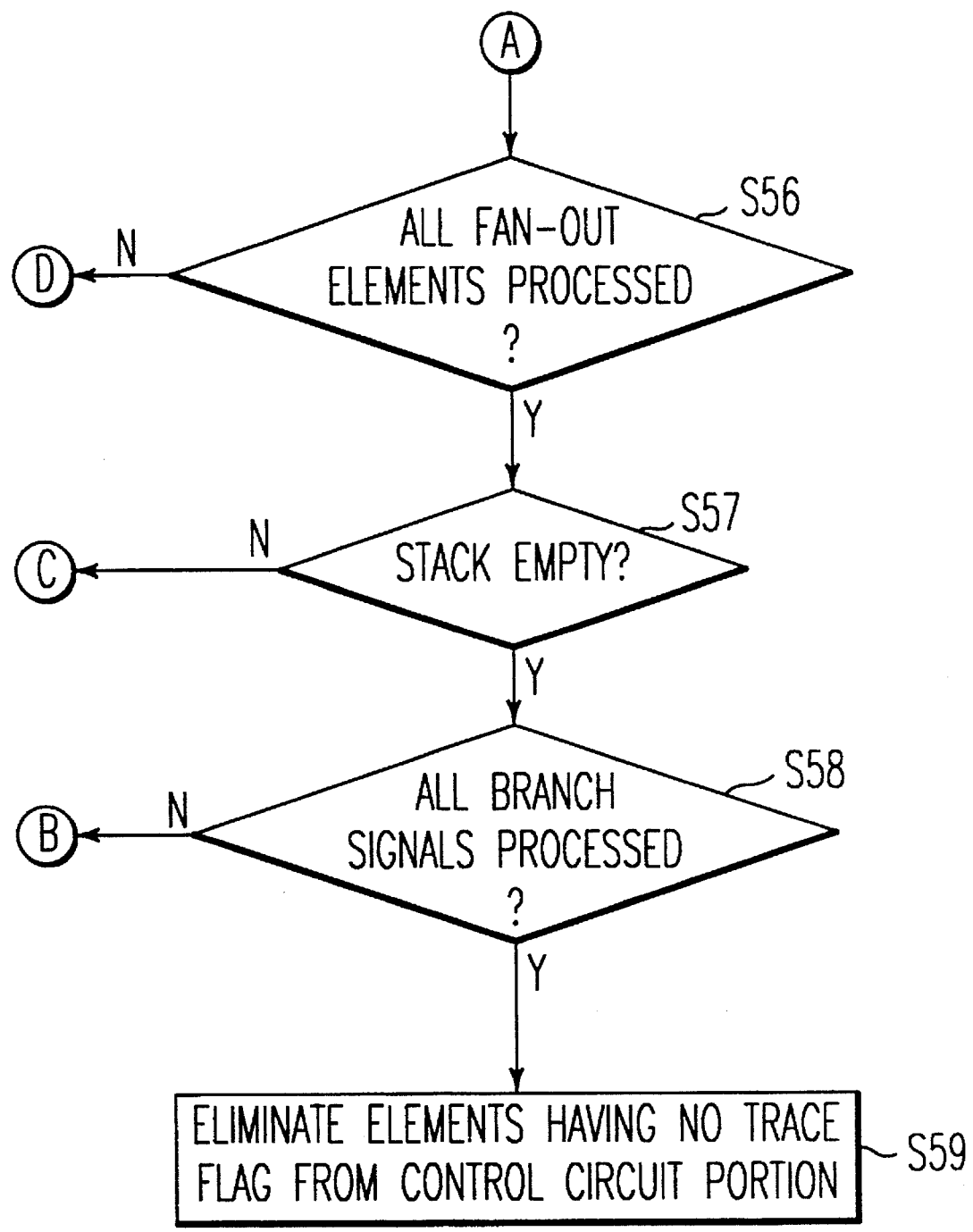
FIG. 12 is a flow chart showing one example of the procedure for realizing the bus checking method according to the second preferred embodiment of the present invention with a computer.

Next, the procedure of realizing the above-described bus checking device using a computer will be described. First, a description will be made on the case of checking the exclusiveness of buses with simulation using FIG. 11 and FIG. 12. The computer checks the exclusiveness of buses according to the procedure shown in FIG. 3 and FIG. 4 and the procedure shown in FIG. 11 and FIG. 12 added thereto. The procedure shown in FIG. 11 and FIG. 12 is inserted between the step S12 and the step S13 shown in FIG. 4. After a control circuit portion is specified in the step S12, it goes to the step S45. In the step S45, signals of which number of fan-outs is 2 or more, that is, branch signals are sought for from the specified control circuit portion. In the step S46, the branch signals found in the step S45 are stored in a stack. In the step S47, one of the stored signals is taken out from the stack. In the step S48, one fan-out element of the signal taken in the step S47 is found.

In the step S49, a determination is made as to whether the fan-out element found in the step S48 is a tri-state element of the bus being processed or not. If the fan-out element is a tri-state element being processed, the procedure proceeds from the step S49 to the step S56. If the fan-out element is not a tri-state element being processed, it proceeds from the step S49 to the step S50.

In the step S50, the fan-out element found in the step S48 is provided with a trace flag. In the step S51, one output signal of the fan-out element provided with the trace flag in the step S50 is sought for.

In the step S52, a determination is made as to whether the output signal found in the step S51 is a wired signal or not. If the output signal is not a wired signal, it proceeds from the step S52 to the step S54. If the output signal is a wired signal, it goes to the next step S53, where all the fan-in elements of that output signal are provided with trace flags, and then it goes to the next step S54. Then, in the step S54, the output signal of the fan-out element found in the step S51 is stored in the stack storing the branch signals in the step S46.

In the step S55, a determination is made as to whether all the output signals of the fan-out element provided with the trace flag in the step S50 have been processed in the steps S51 to S54 or not. If all the output signals of that fan-out element have not been processed, it proceeds to the step S51 from the step S55. If all the output signals of that fan-out element have been already processed, it proceeds to the step S56 from the step S55.

In the step S56, a determination is made as to whether the processes in the steps S48 to S55 have been made about all the fan-out elements of the signal taken out in the step S47 or not. If not all the fan-out elements of the signal have been processed, it proceeds to the step S48 from the step S56. If all the fan-out elements of that signal have been processed, it goes from the step S56 to the step S57.

In the step S57, a determination is made as to whether the processes in the steps S47 to S56 have been made about all the signals stored in the stack storing the branch signals in the step S46 or not. If all the signals in that stack have not been processed yet, it proceeds from the step S57 to the step S47. If all the signals have been processed and the stack is empty, it goes to the step S58 from the step S57.

In the step S58, a determination is made as to whether the processes in the steps S45 to S57 have been made about all the branch signals of the control circuit portion specified in the step S12 or not. If all the branch signals in the control circuit portion have not been processed, it proceeds to the step S45 from the step S58. If all of those signals have been processed, it goes to the step S59 from the step S58, where elements (logic gates and the like) not provided with trace flags are eliminated from the control circuit portion, and it proceeds to the step S13.

Figure 13:
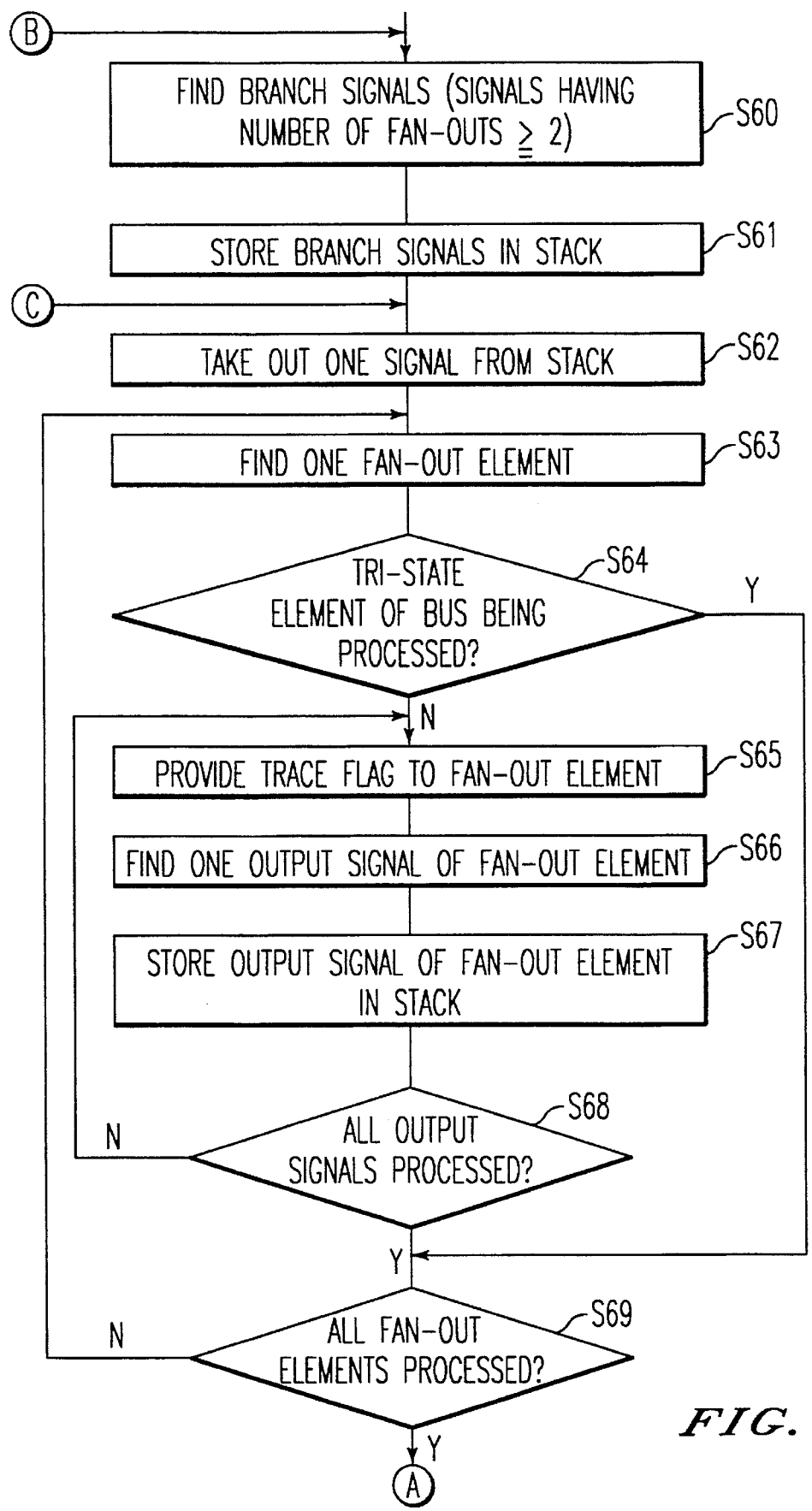
FIG. 13 is a flow chart showing another example of the procedure for realizing the bus checking method according to the second preferred embodiment of the present invention with a computer.
Figure 14:
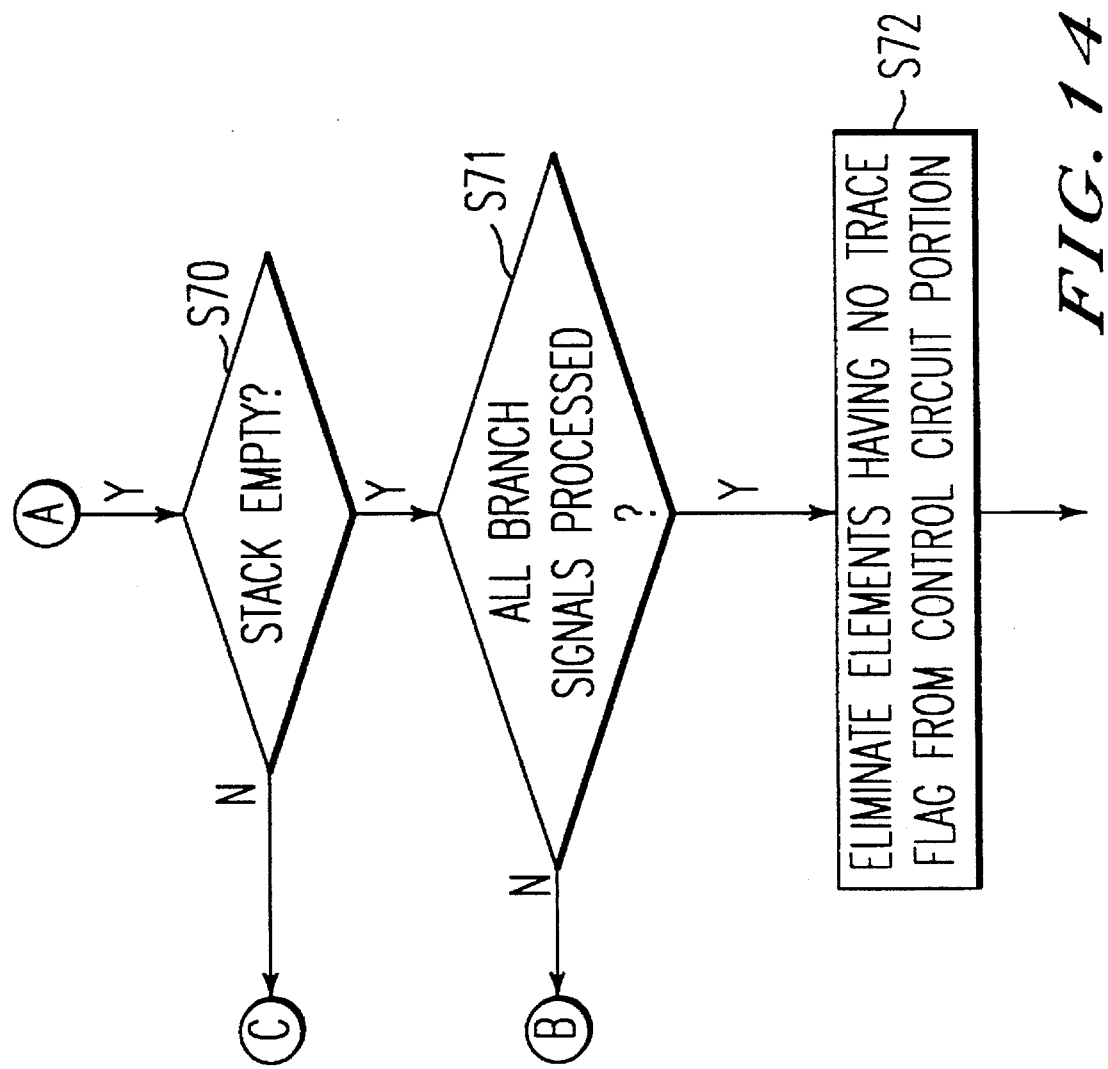
FIG. 14 is a flow chart showing another example of the procedure for realizing the bus checking method according to the second preferred embodiment of the present invention with a computer.

Next, a description will be made about the case of checking the exclusiveness of buses with the output functions referring to FIG. 13 and FIG. 14. The computer checks the exclusiveness of a bus according to the procedure shown in FIG. 5 and FIG. 6 and the procedure shown in FIG. 13 and FIG. 14 added thereto. The procedure shown in FIG. 13 and FIG. 14 is inserted between the step S34 and the step S35 shown in FIG. 6. After a control circuit portion is specified in the step S34, it goes to the step S60. In the step S60, signals having the number of fan-outs are 2 or more, i.e., branch signals are sought for from the specified control circuit portion. In the step S61, the branch signals found in the step S60 are stored in a stack. In the step S62, one of the stored signals is taken out from the stack. In the step S63, one fan-out element of the signal taken out in the step S62 is found out.

In the step S64, a determination is made as to whether the fan-out element found in the step S63 is a tri-state element of the bus being processed or not. If the fan-out element is a tri-state element being processed, the flow proceeds to the step S69 from the step S64. If the fan-out element is not a tri-state element being processed, it proceeds to the step S65 from the step S64.

In the step S65, a trace flag is provided to the fan-out element found in the step S63. In the step S66, one output signal of the fan-out element provided with the trace flag in the step S65 is found out.

In the step S67, the output signal of the fan-out element found in the step S66 is stored in the stack in which the branch signals are stored in the step S61.

In the step S68, a determination is made as to whether the processes in the step S66 to the step S67 have been made about all the output signals of the fan-out element provided with the trace flag in the step S65 or not. If all the output signals of the fan-out element have not been processed, it proceeds from the step S68 to the step S66. If all the output signals of that fan-out element have been processed, it proceed from the step S68 to the step S69.

In the step S69, a determination is made as to whether the processes from the step S63 to the step S68 have been made or not about all the fan-out elements of the signal taken out in the step S62. If all the fan-out elements of that signal have not been processed, it goes to the step S63 from the step S69. If all the fan-out elements of that signal have been processed, it goes to the step S70 from the step S69.

In the step S70, a determination is made as to whether the processes in the steps S62 to S69 have been made about all the signals stored in the stack which stored the branch signals in the step S61 or not. If all the signals in that stack have not been processed, it proceeds to the step S62 from the step S70. If all the signals have been processed and the stack is empty, it goes to the step S71 from the step S70.

In the step S71, a determination is made as to whether the processes from the step S60 to the step S70 have been made about all the branch signals in the control circuit portion specified in the step S34 or not. If all the branch signals in that control circuit portion have not be processed, it proceeds to the step S60 from the step S71. If all of those signals have been processed, it proceeds to the step S72 from the step S71 to eliminate the elements (logic gates or the like) which are not provided with trace flags, and it goes to the step S35.

Third Preferred Embodiment

Figure 15:
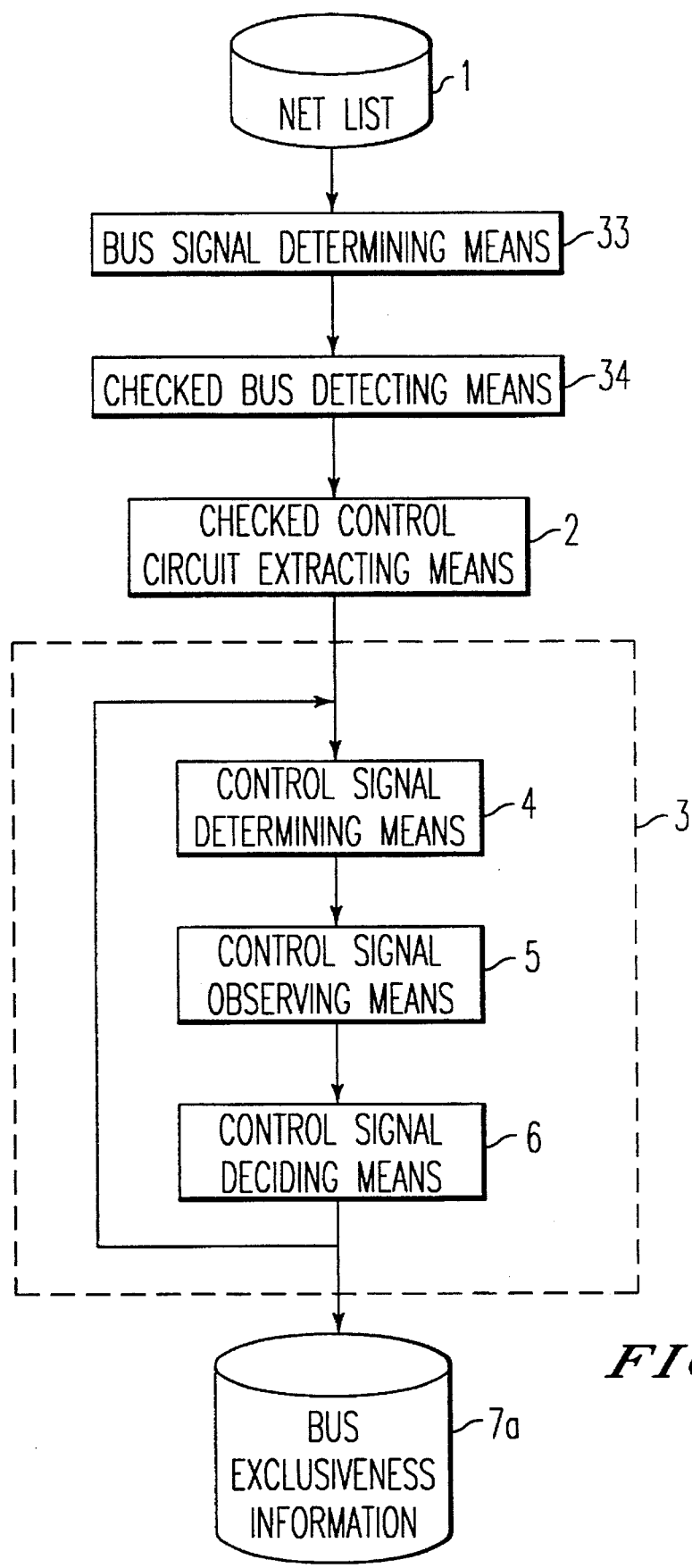
FIG. 15 is a block diagram showing the structure of a bus checking device according to the third preferred embodiment of the present invention.

Next, the third preferred embodiment of the present invention will be described using FIG. 15 and FIG. 16. FIG. 15 is a block diagram showing the structure of a bus checking device according to the third preferred embodiment of the present invention. In FIG. 15, 33 denotes bus signal determining means for determining values of bus signals from signals connected to external inputs fixed to the power source or ground level and the power source/ground using the net list 1 and 34 denotes checked bus detecting means for checking bus signals determined by the bus signal determining means 33, detecting buses with the tri-state structure which are not fixed to signals at the power source or ground level as bus check object buses, and adding information about the bus check object buses to the net list 1 and outputting the same, and other blocks with the same reference characters as those in FIG. 1 denote portions corresponding to the blocks shown in FIG. 1. The checked control circuit extracting means 2 extracts control circuit portions using the net list provided from the checked bus detecting means 34. Accordingly, the checked control circuit extracting means 2 dose not extract control circuit portions about buses which are not objects of the bus check.

Figure 16:
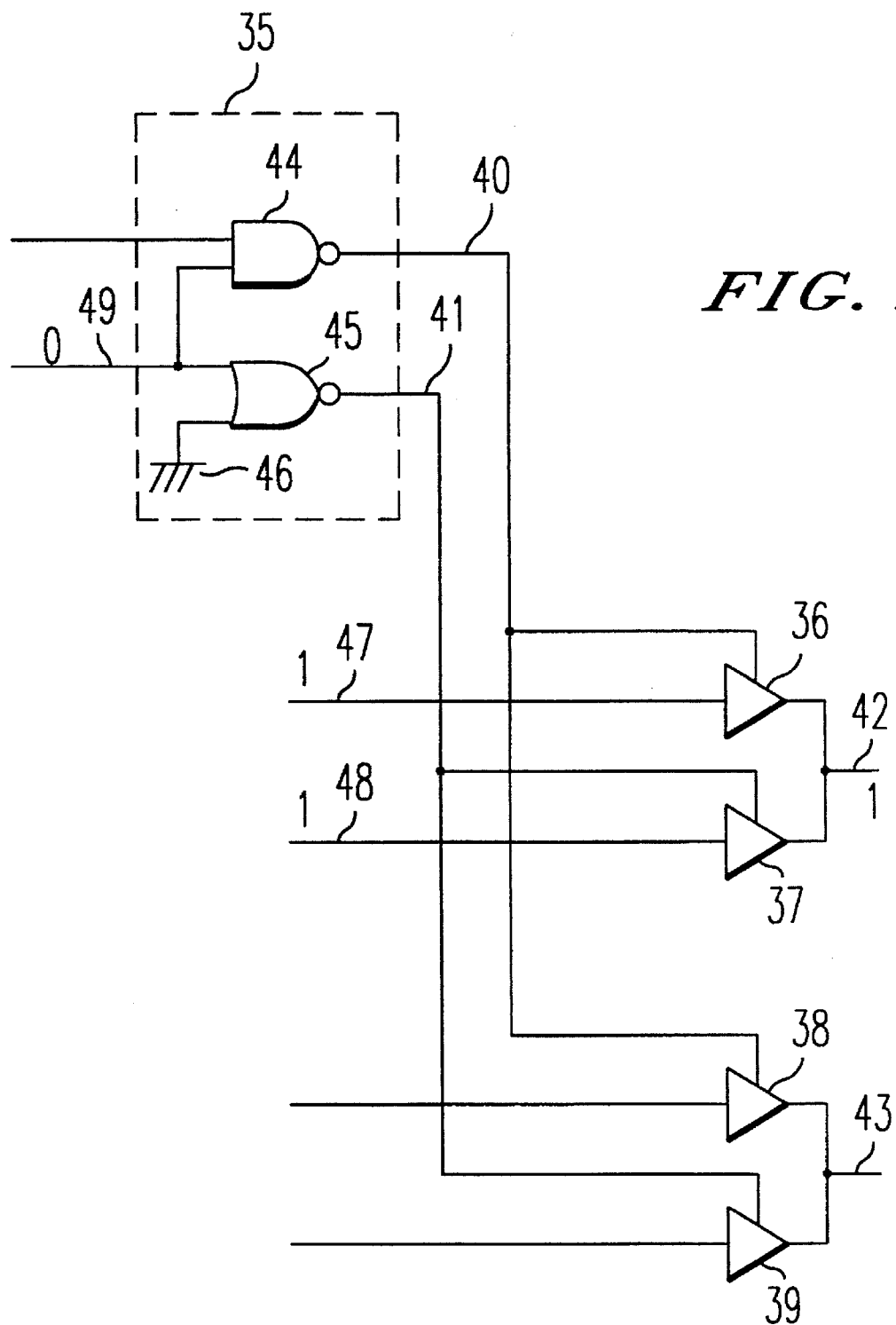
FIG. 16 is a logic diagram showing one example of a circuit which is an object of processing by the bus checking device according to the third preferred embodiment of the present invention.

FIG. 16 is a logic diagram showing part of a logic circuit including a bus fixed to the power source and ground level signals (1/0 fixed). In FIG. 16, 36–39 denote tri-state drivers, 40 denotes a bus control signal line connected to control terminals of the tri-state drivers 36 and 38, 41 denotes a bus control signal line connected to control terminals of the tri-state drivers 37 and 39, 35 denotes a bus control circuit for controlling the tri-state drivers 36–39 through the bus control signal lines 40 and 41, 42 denotes a bus signal line fixed to the power source level, 43 denotes a bus signal line which is not fixed to the power source or ground level, 44 denotes a NAND gate having its output connected to the bus control signal line 40, 45 denotes a NOR gate having its output connected to the bus control signal line 41 and its one input connected to one input of the NAND gate 44, 46 denotes a ground potential point to which the other input of the NOR gate 45 is connected, 47 and 48 denote signal lines respectively connected to inputs of the tri-state drivers 36 and 37 and fixed to the power source level, and 49 denotes a signal line connected to one input of the NOR gate 45 and fixed to the ground level. The bus control circuit 35 includes the NAND gate 44 and the NOR gate 45.

If the bus structured as shown in FIG. 16 is described in the net list 1 shown in FIG. 15, the bus signal determining means 33 inputs the 1/0 fixed signal lines 47–49 and the fixed values to determine bus signal values of the bus signal lines 42 and 43. That is to say, the value of the signal line 42 can be determined to be 1. The checked bus detecting means 34 shown in FIG. 15 detects a bus having the bus signal line 43 not fixed to the signal value at the power source or ground level. The bus checking device then executes the exclusiveness check of the bus as in the first preferred embodiment with the checked control circuit extracting means 2 and the exclusiveness checking means 3 for the detected bus.

As described above, part of logic of the data controlled by the bus is also considered, which enables corrector bus check. Also, since buses not to be checked are deleted in advance, the checking efficiency can be enhanced.

Figure 17:
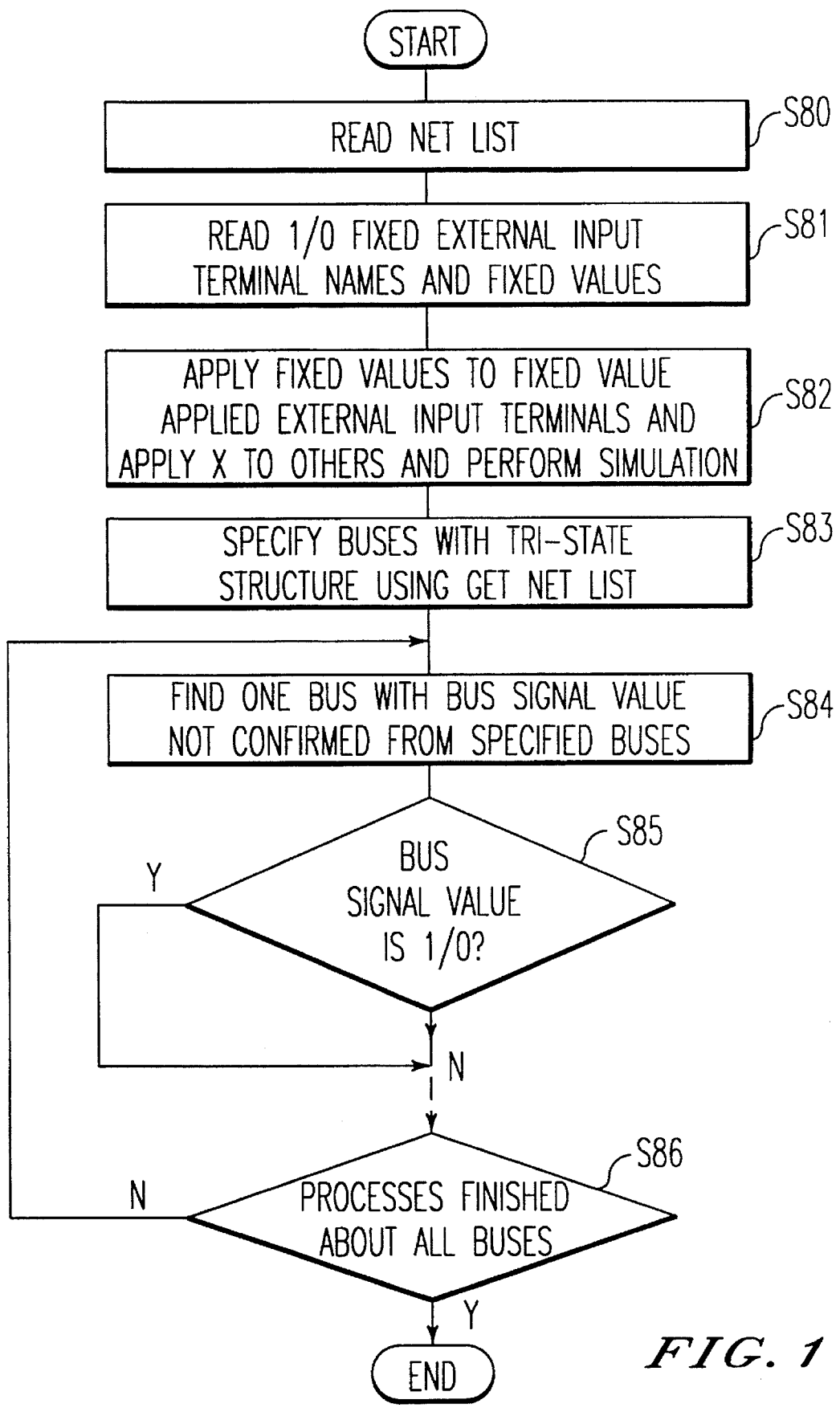
FIG. 17 is a flow chart showing one example of the procedure for realizing the bus checking method according to the third preferred embodiment of the present invention with a computer.

Next, the procedure in the case of realizing the above-described bus checking device using a computer will be described using FIG. 17. The computer checks the exclusiveness of buses according to the procedure shown in FIG. 3 and FIG. 4 or FIG. 5 and FIG. 6 and the procedure shown in FIG. 17 added. The procedure shown in FIG. 3 and FIG. 4, or FIG. 5 and FIG. 6 is inserted between the step S85 and the step S86 shown in FIG. 17. The processes in the steps S80 to S85 are performed in place of the step S1 to the step S3, or the step S21 to the step S23. Also, the step S86 is executed in place of the step S19 or the step S42. That is to say, it starts and the net list is read in the step S80. Next, in the step S81, names of 1/0 fixed external input terminals and the fixed values are read. In the step S82, using the net list, the 1/0 fixed external input terminal names and the fixed values, the fixed values are applied to the fixed value applied external input terminals and unfixed values (X) are applied to other external input terminals to execute simulation, and a signal value of the bus is determined.

In the step S83, buses with the tri-state element structure are specified using the net list. In the step S84, one bus of which bus signal value is not confirmed yet is found out from the buses specified in the step S83.

In the step S85, a determination is made as to whether the signal value of the bus extracted in the step S84 is 1/0 or not. If the signal value of the bus is 1/0, it proceeds to the step S86 from the step S85. If the signal value of the bus is not 1/0, it proceeds from the step S85 to the step S4 in FIG. 3, for example, the processes after the step S4 are made about the bus extracted in the step S84, and it proceeds to the step S86 after the step S18.

In the step S86, a determination is made as to whether the processes have been finished about all the buses specified in the step S83 or not. If there remains any bus which has not been checked yet, it proceeds to the step S84 from the step S86, and if all the buses to be checked have been checked, the entire process is ended.

Fourth Preferred Embodiment

Figure 18:
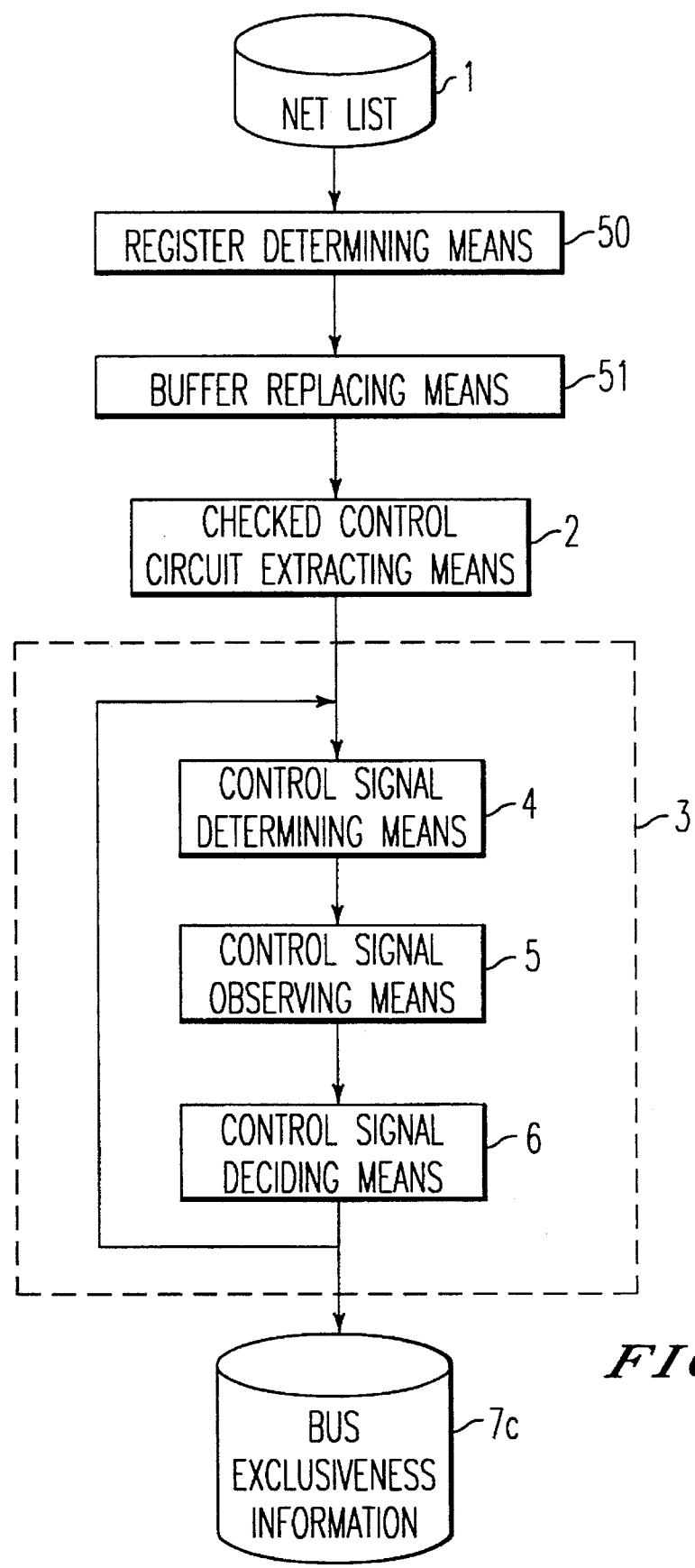
FIG. 18 is a block diagram showing the structure of a bus checking device according to the fourth preferred embodiment of the present invention.

Next, the fourth preferred embodiment of the present invention will be described using FIG. 18 through FIG. 20). FIG. 18 is a block diagram showing the structure of a bus checking device according to the fourth preferred embodiment of the present invention. In the figure, 50 denotes register detecting means for detecting registers in a bus control circuit which operate with free-running clocks using the net list 1 and 51 denotes buffer replacing means for replacing the registers detected by the register detecting means 50 with buffers, and blocks with the same reference characters as those in FIG. 1 denote portions corresponding to the blocks shown in FIG. 1. The exclusiveness information of buses outputted from the bus checking device is information different from the information outputted from the bus checking device shown in FIG. 1.

Next, the operation of the bus checking device shown in FIG. 18 will be described using FIG. 19 and FIG. 20. FIG. 19 is a logic diagram of a bus having registers which operate with free-running clocks in a bus control circuit and FIG. 20 is a logic diagram of a bus where the registers in the bus control circuit of FIG. 19 are replaced by buffers. In FIG. 19 and FIG. 20, 52 denotes a bus control circuit, 53–56 denote tri-state drivers controlled by the bus control circuit 52, 57–60 denote bus control signal lines connected to control terminals of the tri-state drivers 53–56 respectively for propagating control signals of the bus control circuit 52, 61 denotes a bus signal line connected to outputs of the tri-state drivers 53–56 in common, 62 denotes a 2-input 4-output decoder forming the bus control circuit 52, 63–66 denote registers having outputs connected to the bus control signal lines 57–60 and operating with free-running clocks for temporarily holding outputs Y0–Y3 of the decoder 62, respectively, 67 denotes a free-running clock signal line for supplying free-running clocks to the registers 63–66 and 68–71 denote buffers provided in place of the registers 63–66.

Figure 19:
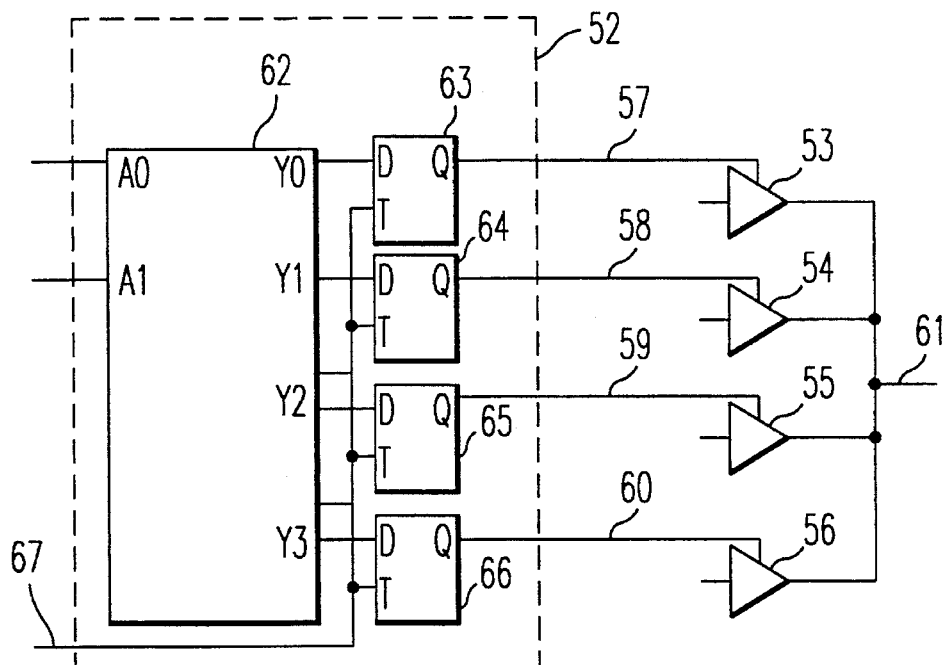
FIG. 19 is a logic diagram showing one example of a circuit which is an object of processing by the bus checking device according to the fourth preferred embodiment of the present invention.
Figure 20:
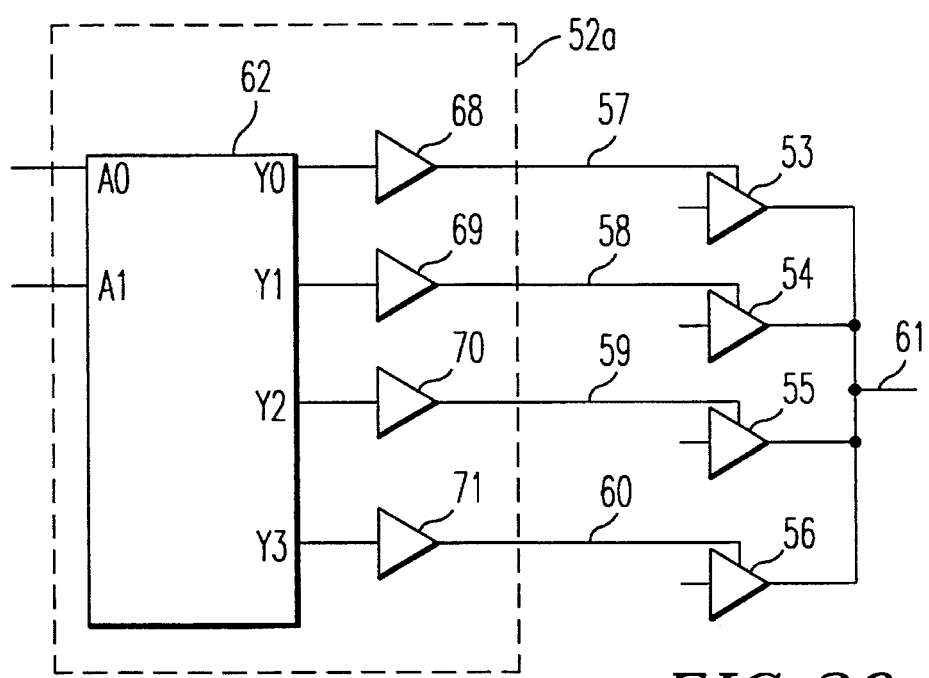
FIG. 20 is a logic diagram showing a circuit obtained after the bus checking device according to the fourth preferred embodiment has processed the circuit of FIG. 19.

If such a circuit as shown in FIG. 19 is described in the net list 1, the register detecting means 50 shown in FIG. 18 traces the free-running clock signal line 67 distinguishing it from other logic gates to detect the registers 63–66 which operate with free-running clocks from the bus control circuit 52. The buffer replacing means 51 replaces the traced registers 63–66 with the buffers 68–71, respectively. The bus checking device applies the exclusiveness check same as that in the first preferred embodiment using the checked control circuit extracting means 2 and the exclusiveness checking means 3 to such a bus control circuit 52a as shown in FIG. 20 which is obtained as the result.

As described above, by replacing the registers operating with free-running clocks with buffers, the circuit portion which is an object of the exclusiveness check becomes larger to enable more accurate bus check.

Figure 21:
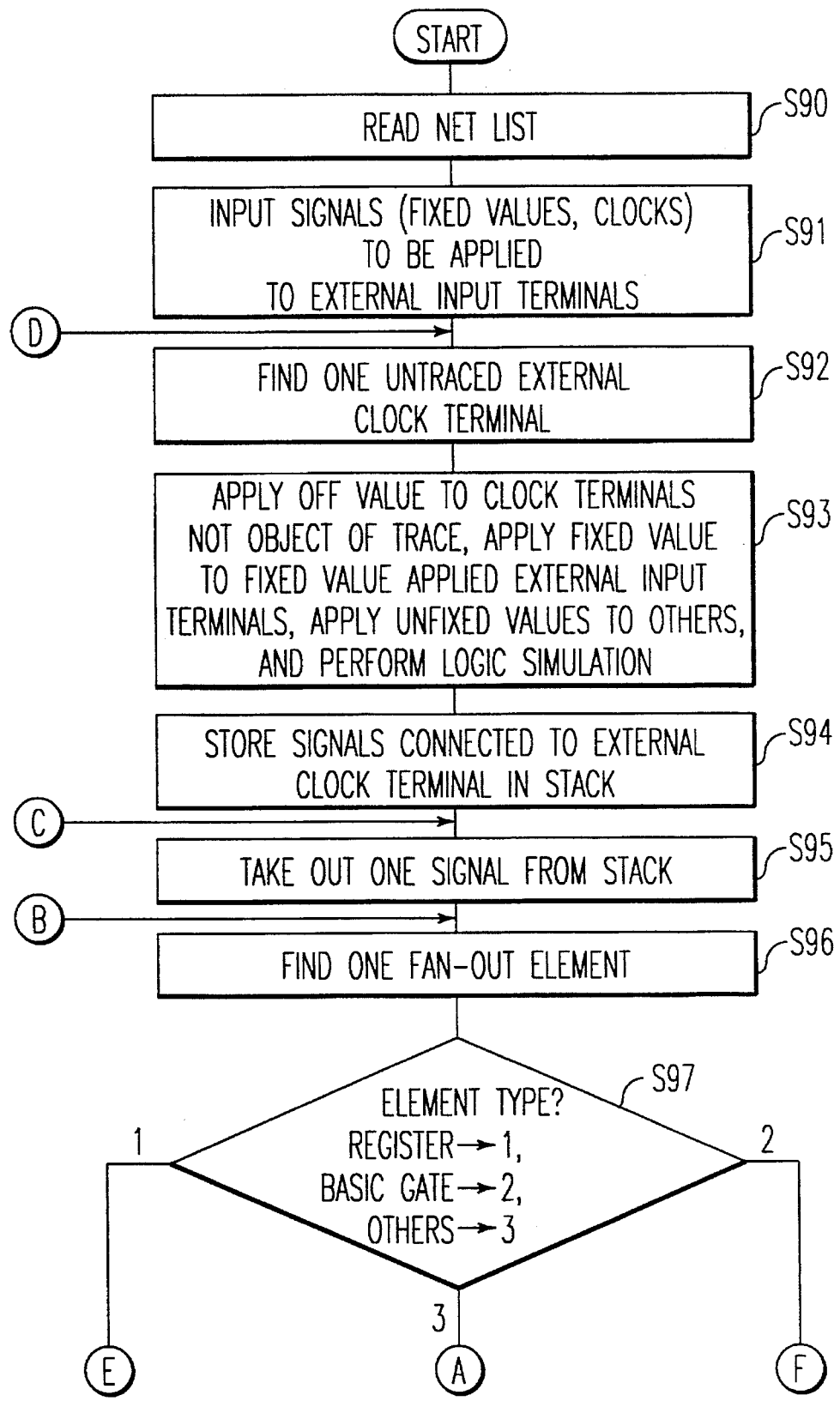
FIG. 21 is a flow chart showing one example of the procedure for realizing the bus checking method according to the fourth preferred embodiment of the present invention with a computer.
Figure 22:
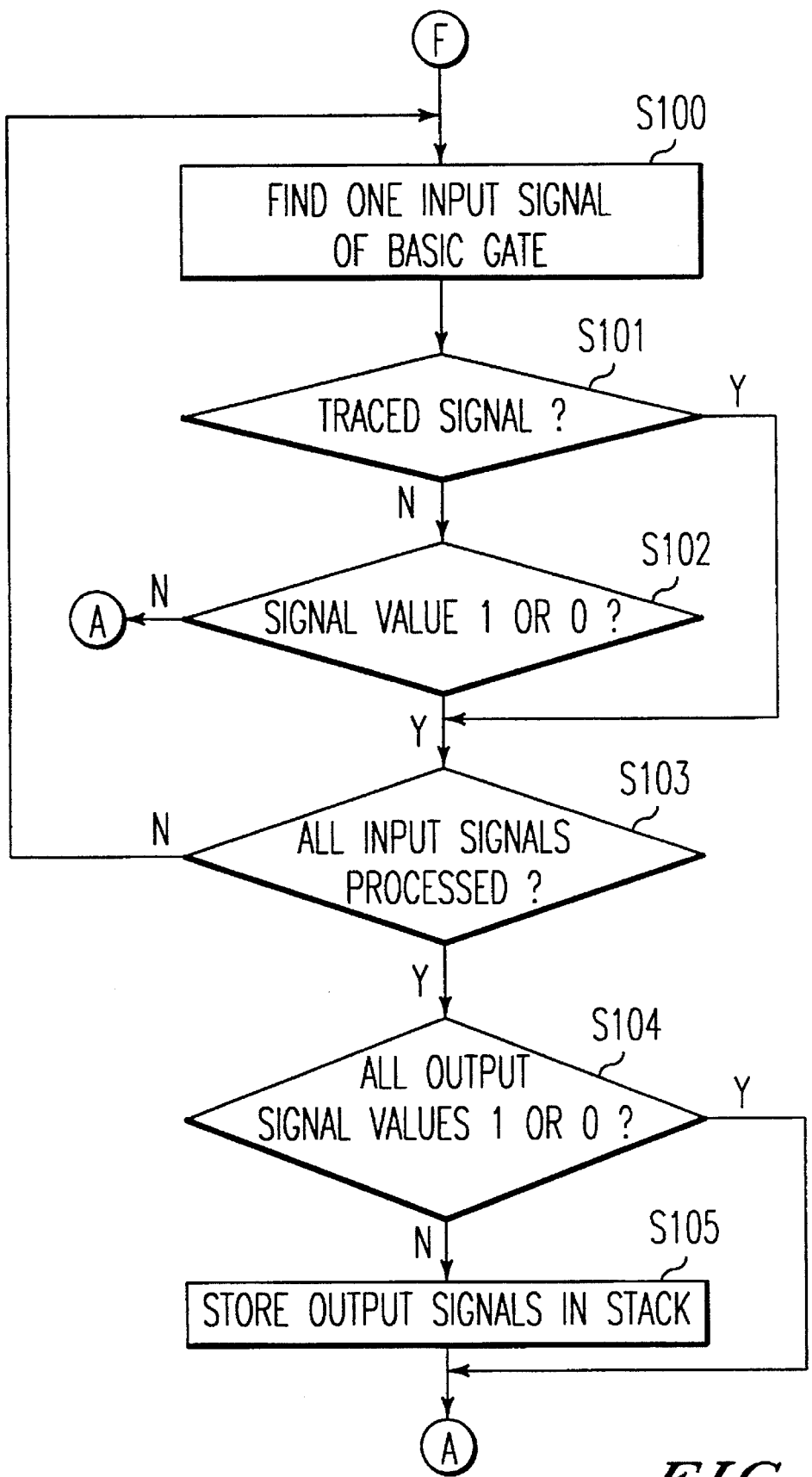
FIG. 22 is a flow chart showing one example of the procedure for realizing the bus checking method according to the fourth preferred embodiment of the present invention with a computer.
Figure 23:
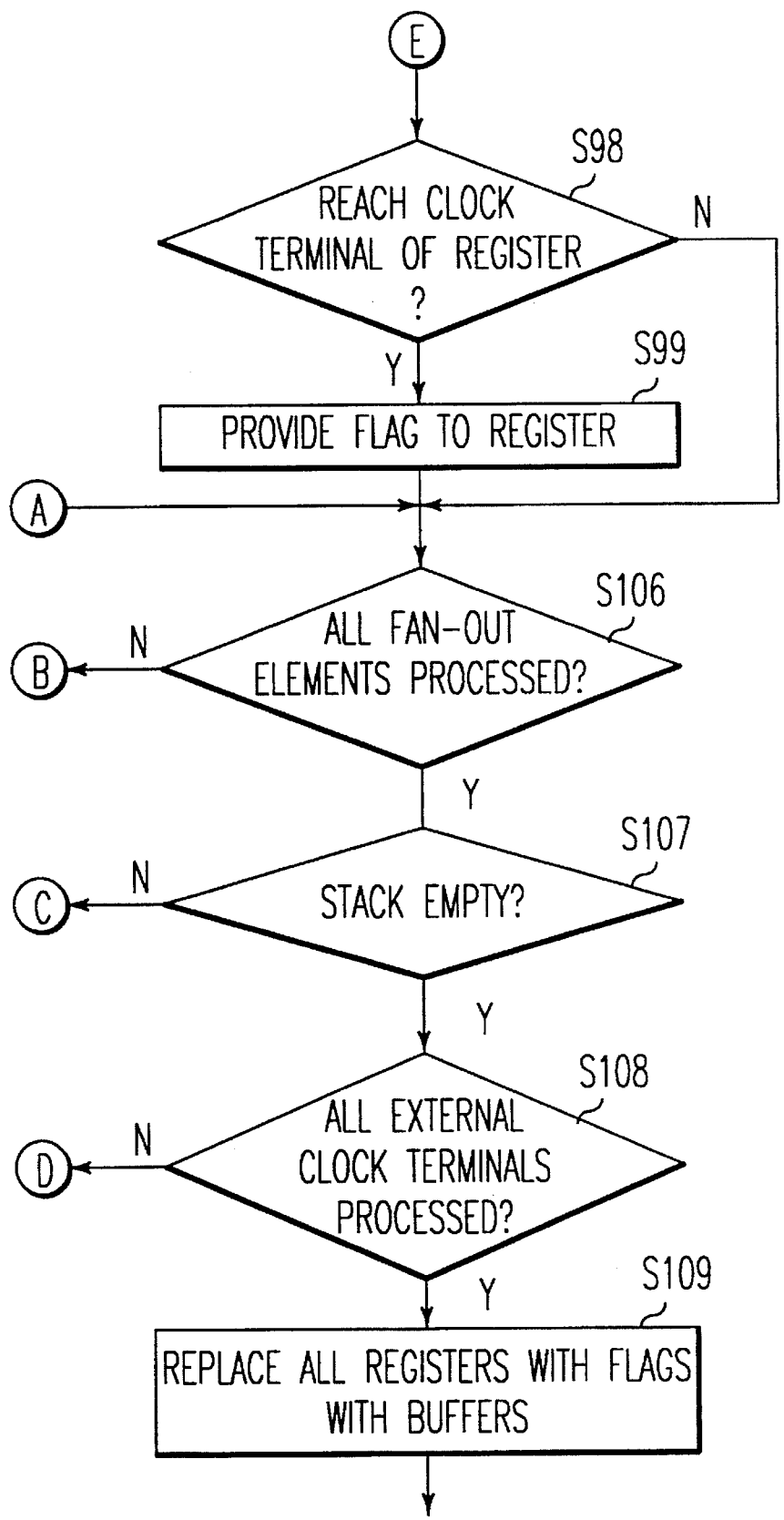
FIG. 23 is a flow chart showing one example of the procedure for realizing the bus checking method according to the fourth preferred embodiment of the present invention with a computer.

Next, the procedure in the case of realizing the above-described bus checking device using a computer will be described using FIGS. 21 through 23. The computer checks the exclusiveness of buses according to the procedure shown in FIG. 3 and FIG. 4, or FIG. 5 and FIG. 6 with the procedure shown in FIGS. 21 through 23 added thereto. The procedure shown in FIG. 3 and FIG. 4, or FIG. 5 and FIG. 6 is inserted after the step S109 shown in FIG. 23. The net list read in the step S1 or in the step S21 is the net list which have been subjected to the processes to the step S109. It starts and then the net list is read in the step S90. Next, in the step S91, signals to be applied to external input terminals (fixed values, clocks) are inputted. In the step S92, one external clock which has not been traced is found out on the basis of the signals inputted in the step S91. In the step S93, using the net list and the fixed values and clocks applied to the external input terminals, off values are provided to external clock terminals which are not objects of the trace, fixed values are provided to fixed value applied external input terminals and unfixed values X are provided to other external input terminals and the simulation is performed.

In the step S94, signals connected to the external clock terminal are stored in a stack. In the step S95, one signal is taken out from the stack storing the signals in the step S94. In the step S96, one fan-out element connected to the signal taken out in the step S95 is found out.

In the step S97, the element type of the fan-out element found in the step S96 is determined. If the fan-out element is a register, it proceeds to the step S98 from the step S97. If that fan-out element is a basic gate, it proceeds to the step S100 from the step S97. If the fan-out element is not a register nor a basic gate, it proceeds to the step S106 from the step S97.

In the step S98, a determination is made as to whether the signal taken out in the step S95 is connected to a clock terminal of a register or not, that is to say, whether the trace of the signal has reached a clock terminal of a register or not. If the traced signal has reached a clock terminal of a register, it proceeds to the step S99, where the register is provided with a flag, and it proceeds to the step S106.

In the step S100, one input signal of the basic gate is found out. In the step S101, a determination is made as to whether the signal found in the step S100 is the traced signal or not. If the signal is not the traced signal, it proceeds to the step S102. If the signal is the traced signal, it proceeds to the step S103.

In the step S102, a determination is made as to whether the signal value of that signal found in the step S100 is 1 or 0, or not. If the signal value of that signal is not 1 or 0, it proceeds to the step S106. If the signal value of that signal is 1 or 0, it proceeds to the step S103.

In the step S103, a determination is made as to whether all the signals found in the step S100 have been processed or not. If all of those signals have been processed, it proceeds to the step S104. If all of the signals have not been processed, it proceeds to the step S100.

In the step S104, a determination is made as to whether the signal values of all the output signals of the basic gate are 1 or 0 or not. If the signal values of all the signals are not 1 or 0, it proceeds to the step S105 to store the output signals in the stack in which the signals are stored in the step S94 and it goes to the step S106. If the signal values of all the signals are 1 or 0, it goes to the step S106.

In the step S106, a determination is made as to whether all fan-out elements have been processed about the signal taken out in the step S95. If the processes have been done about all the fan-out elements, it goes to the step S107. If all the fan-out elements have not been processed, it goes to the step S96.

In the step S107, a determination is made as to whether the stack storing the signals in the step S94 is empty or not. If the stack is empty, it goes to the step S108. If the stack is not empty, it goes to the step S95.

In the step S108, a determination is made as to whether all of the traced external clock terminals have been processed or not. If all of the external clock terminals have been processed, it proceeds to the step S109. If all of the external clock terminals have not been processed, it proceeds to the step S92. In the step S109, all the registers provided with flags are replaced by buffers.

Fifth Preferred Embodiment

Figure 24:
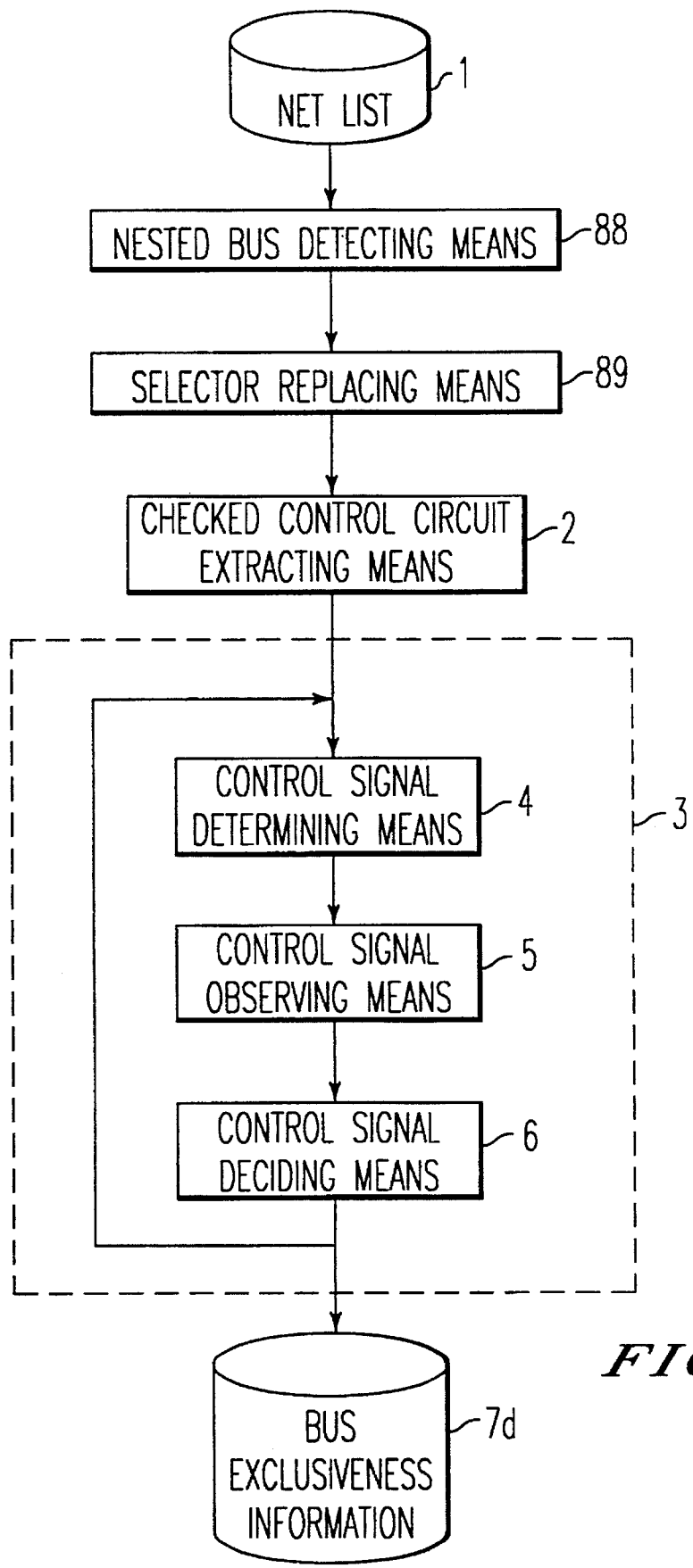
FIG. 24 is a block diagram showing the structure of a bus checking device according to the fifth preferred embodiment of the present invention.

The fifth preferred embodiment of the present invention will be described referring to FIGS. 24 through 26. FIG. 24 is a block diagram showing the structure of a bus checking device according to the fifth preferred embodiment of the present invention. In FIG. 24, 88 denotes nested bus detecting means for detecting nested buses from wired signals using the net list 1 and 89 denotes selector replacing means for replacing nested buses detected by the nested bus detecting means 88 with selectors of the AND-OR structure, and blocks with the same reference characters as those in FIG. 1 denote parts corresponding to the blocks shown in FIG. 1. The exclusiveness information of buses outputted from the bus checking device is different from the information outputted from the bus checking device shown in FIG. 1.

Next, one example of the operation of the bus checking device shown in FIG. 24 will be described referring to FIG. 25 and FIG. 26. FIG. 25 is a logic diagram of a bus having nested buses in a bus control circuit and FIG. 26 is a logic diagram of the bus after the nested buses in the bus control circuit of FIG. 25 are replaced by selectors of the AND-OR type. In FIG. 25 and FIG. 26, 74 and 74a denote bus control circuits, 75 and 76 denote tri-state drivers controlled by the bus control circuit 74 or 74a, 77 and 78 denote bus control signal lines connected to control terminals of the tri-state drivers 75 and 76 respectively for propagating control signals of the bus control circuit 74 or 74a, 79 denotes a bus signal line connected to outputs of the tri-state drivers 75 and 76 in common, 80 and 81 denote 1-input 2-output decoder provided in the bus control circuit 74 or 74a for decoding inputs to the bus control circuit, 82 and 83 denote nested buses provided in the bus control circuit 74 and connected to the bus control signal lines 77 and 78 respectively, and 84 and 85 denote selectors with the AND-OR structure provided in the bus control circuit 74a in place of the nested buses 82 and 83 and connected to the bus control signal lines 77 and 78, respectively.

Figure 25:
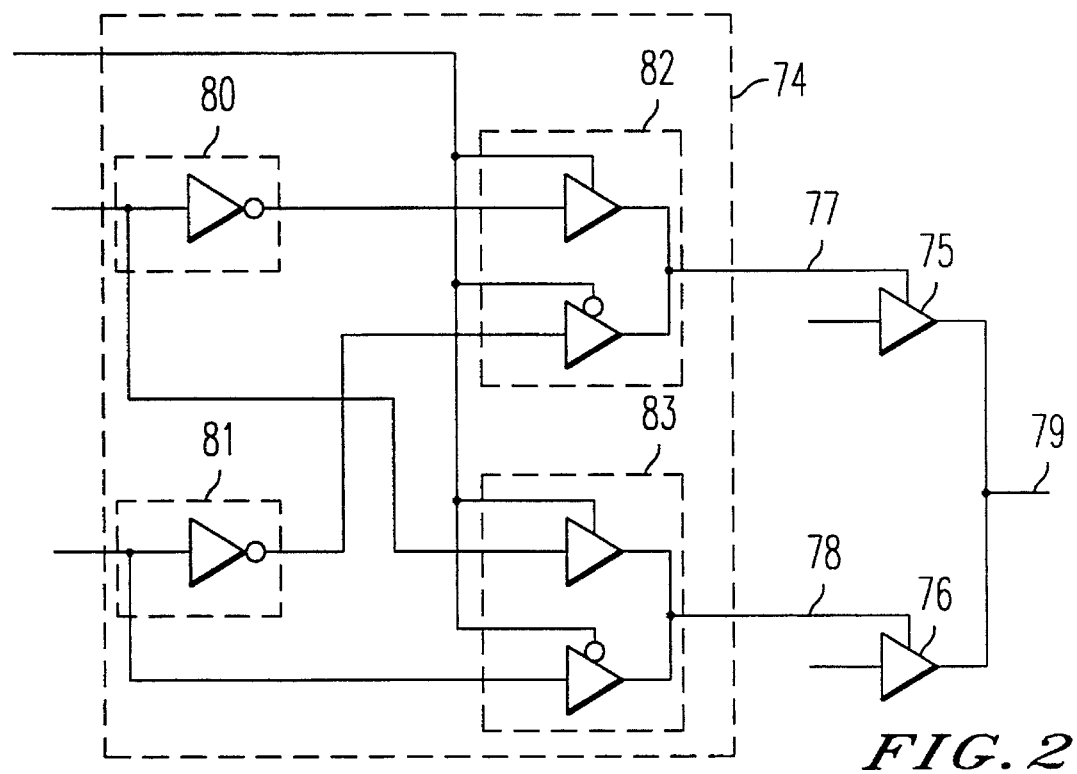
FIG. 25 is a logic diagram showing one example of a circuit which is an object of processing by the bus checking device according to the fifth preferred embodiment of the present invention.
Figure 26:
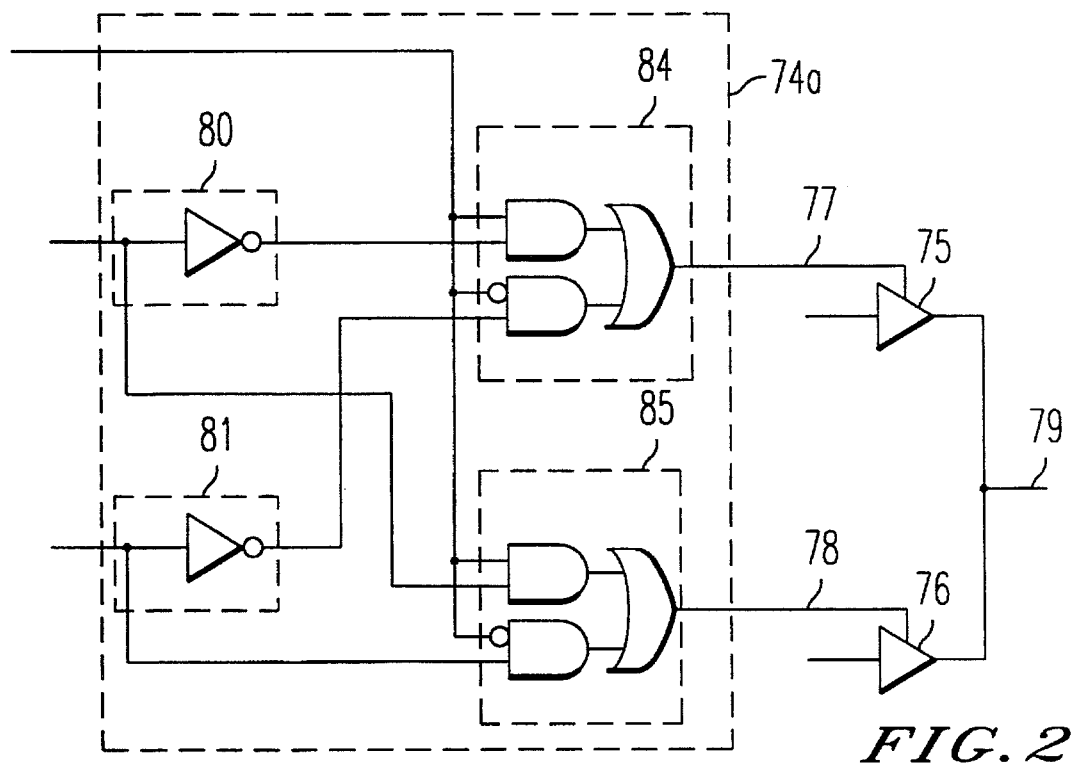
FIG. 26 is a logic diagram showing a circuit obtained after the bus checking device according to the fifth preferred embodiment has processed the circuit of FIG. 25.

If such a circuit as shown in FIG. 25 is described in the net list 1, the nested bus detecting means 88 shown in FIG. 24 traces the bus control signal lines 77 and 78 backward (in the direction opposite to the signal flow) using the net list 1 to find wired signals to detect the nested buses 82 and 83 from the bus control circuit 74. The selector replacing means 89 shown in FIG. 24 then replaces the nested buses 82 and 83 with the selectors 84 and 85 of the AND-OR structure. To such a bus control circuit 74a as shown in FIG. 26 obtained as described above, the bus checking device executes the check of exclusiveness with the checked control circuit extracting means 2 and the exclusiveness checking means 3.

As described above, by replacing the nested buses with selectors of the AND-OR structure, the circuit portion which is an object of the exclusiveness check becomes larger to enable more precise bus checks.

Figure 27:
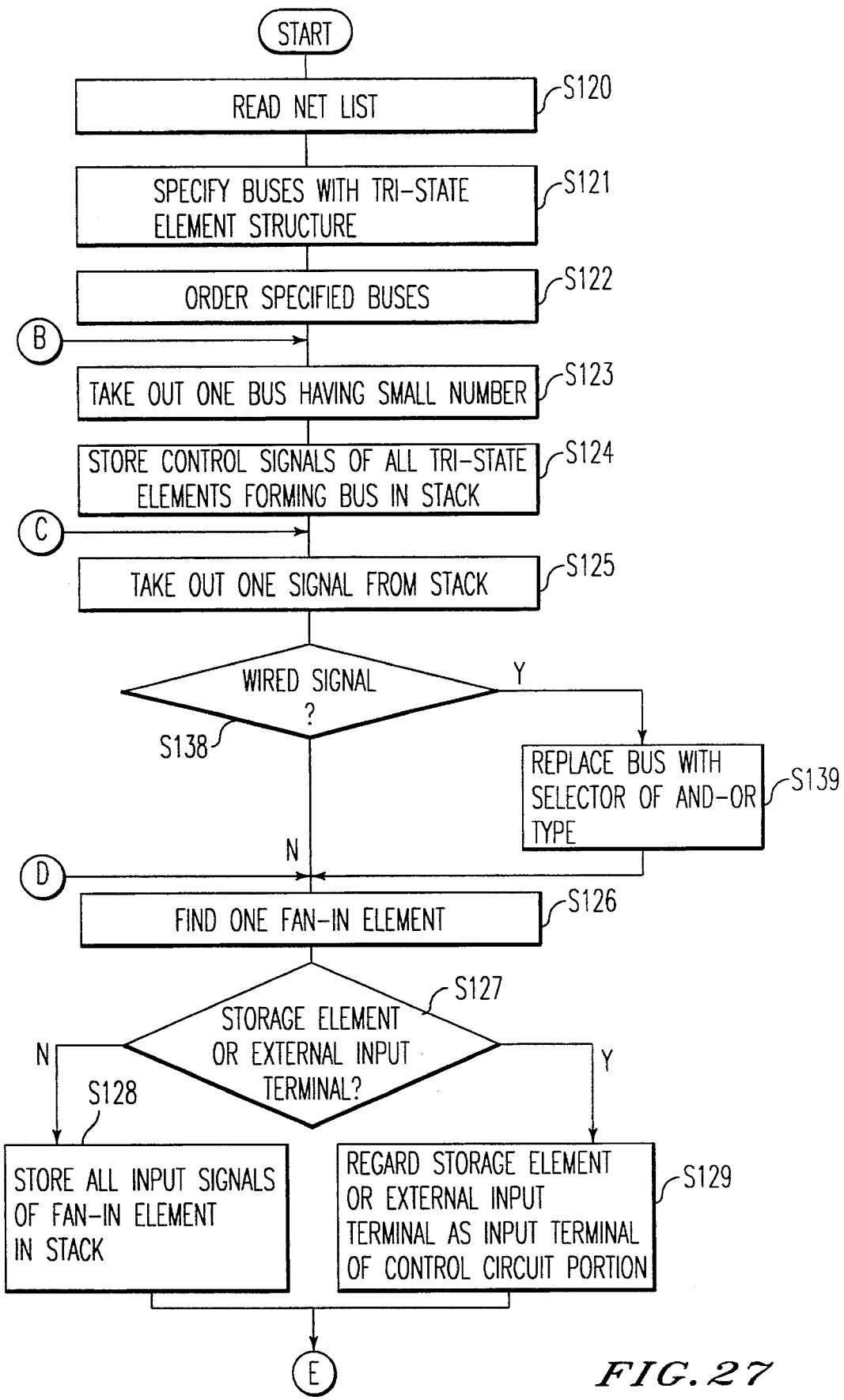
FIG. 27 is a flow chart showing one example of the procedure for realizing the bus checking method according to the fifth preferred embodiment of the present invention with a computer.
Figure 28:
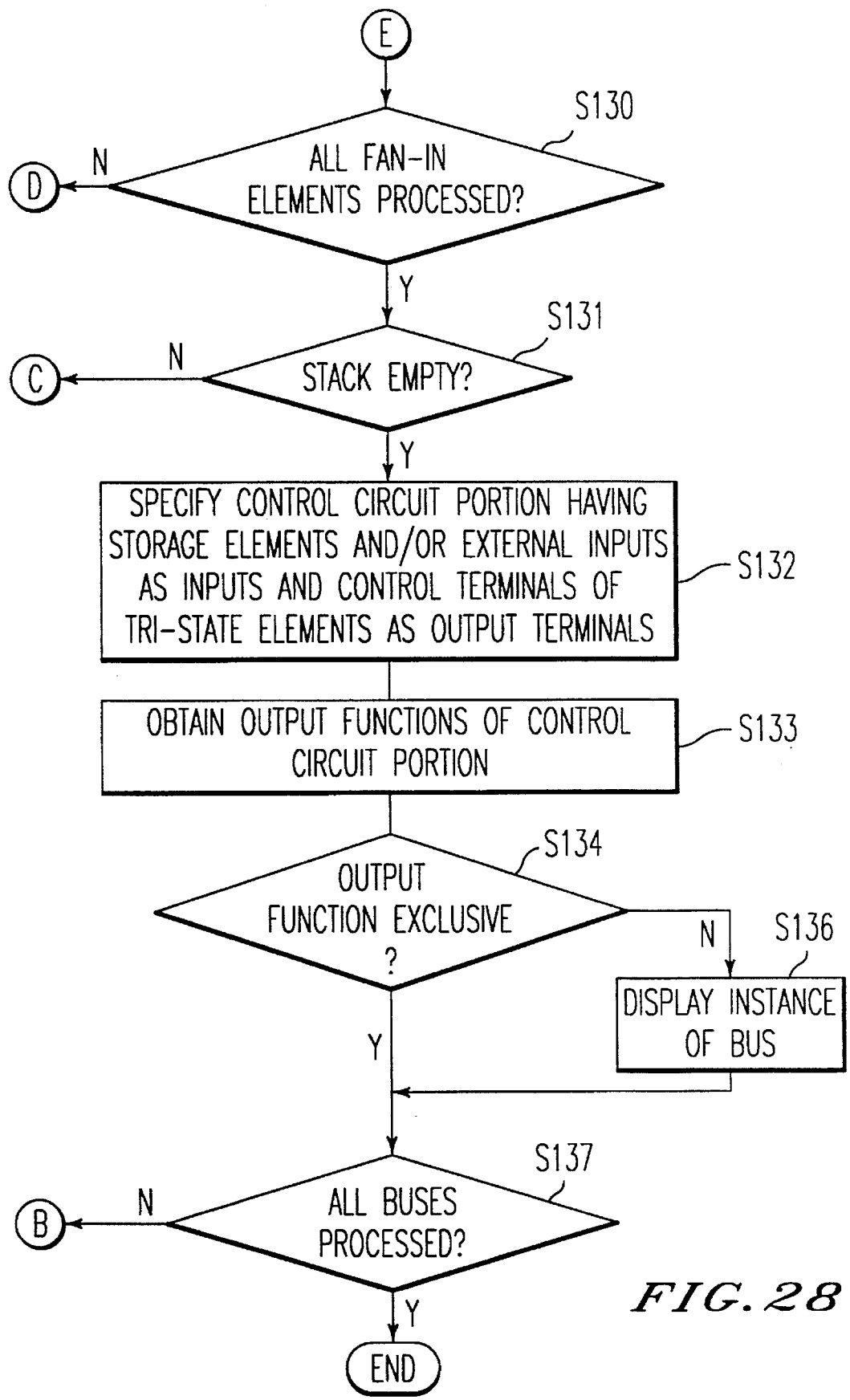
FIG. 28 is a flow chart showing one example of the procedure for realizing the bus checking method according to the fifth preferred embodiment of the present invention with a computer.

Next, the procedure of realizing the above-described bus checking device with a computer will be described referring to FIG. 27 and FIG. 28. It starts and first the net list is read in the step S120. Next in the step S121, buses with the tri-state element structure are specified using the net list read in the previous step. In the step S122, the specified buses are ordered. That is to say, they are numbered so that a bus which is closest to an external input is provided with the smallest number and a bus which is closest to an external output is provided with the largest number.

In the step S123, one bus having a small number and which has not been checked for the exclusiveness is extracted from the buses of the tri-state element structure numbered in the previous step. In the step S124, control signals of all the tri-state elements forming the bus extracted in the step S123 are stored in a stack. In the step S125, one of the stored signals is taken out from the stack storing the control signals of the tri-state elements in the step S124. In the step S138, a determination is made as to whether the signal extracted in the step S125 is a wired signal or not. If the extracted signal is a wired signal, it proceeds to the step S139, where the bus having the wired signal as a bus signal is replaced by a selector of the AND-OR type and then it goes to the step S126. If the taken signal is not a wired signal, it goes to the step S126.

In the step S126, one fan-in element connected to this control signal is found out. In the step S127, a determination is made as to whether the fan-in element found in the step S126 is a storage element or an external input terminal or not, and if it is not a storage element or an external input terminal, it goes to the step S128, and if it is a storage element or an external input terminal, it goes to the step S129.

In the step S128, all the input signals of the fan-in element are stored in the stack storing the control signals in the step S124 and it goes to the step S130. In the step S129, the storage element or the external input terminal connected to this signal is defined as an input terminal of the control circuit portion and then it goes to the step S130.

In the step S130, a determination is made as to whether the processes to the step S130 have been finished about all the fan-in elements connected to the signal which is an object in the step S125. If the processes have been finished about all the fan-in elements, it proceeds to the step S131 from the step S130, and if there remains any unprocessed element, it proceeds to the step S126 from the step S130.

In the step S131, a determination is made as to whether the stack storing the control signals in the step S124 is empty or not. If the stack is empty, it proceeds to the step S132 from the step S131, and if the stack is not empty, it proceeds to the step S125 from the step S131.

In the step S132, a control circuit portion is specified having storage elements and/or external input terminals as input terminals and control terminals of tri-state elements as output terminals. In the step S133, output functions of the control circuit portion specified in the step S132 are obtained.

In the step S134, a determination is made as to whether the output functions are exclusive or not. If the output functions are exclusive, it goes to the step S137. If the output functions are not exclusive, it goes from the step S134 to the step S136, where an instance of the bus is displayed and then it goes to the step S137.

In the step S137, a determination is made as to whether all the buses specified in the step S121 have been processed or not. If there are any unchecked buses, it goes from the step S137 to the step S123, and if all the buses to be checked have been checked, all the processes are ended.

Sixth Preferred Embodiment

Figure 29:
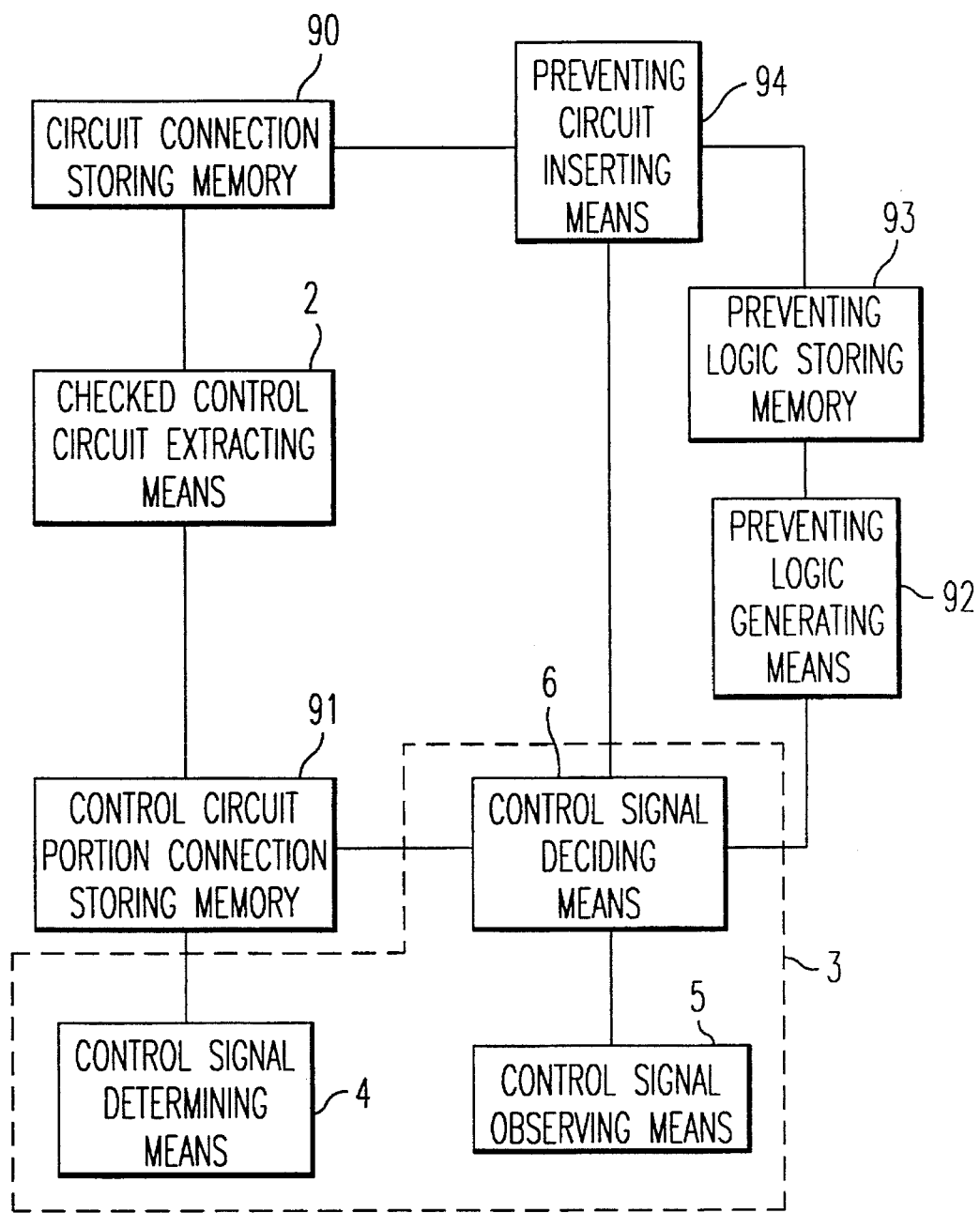
FIG. 29 is a block diagram showing the structure of a bus checking device according to the sixth preferred embodiment of the present invention.

Next, the sixth preferred embodiment of the present invention will be described using FIGS. 29 through 31. FIG. 29 is a block diagram showing the structure of a bus checking device according to the sixth preferred embodiment of the present invention. In FIG. 29, 90 denotes a circuit connection storing memory for storing a net list of a designed circuit, 2 denotes checked control circuit extracting means for extracting a control circuit portion concerned with determination of control signals from the connection information of the circuit stored in the circuit connection storing memory 90 according to a predetermined rule and 91 denotes a control circuit portion connection storing memory for storing connection information of the control circuit portion extracted from the net list. The control signal determining means 4, the control signal observing means 5 and the control signal deciding means 6 check the exclusiveness of buses on the bases of the connection information of the control circuit portion stored in the control circuit portion connection storing memory. Furthermore, 92 denotes preventing logic generating means for generating a logic for preventing occurrence of signal conflict or floating of a bus which is decided to have possibility of signal conflict or floating by the exclusiveness checking means, 93 denotes a preventing logic storing memory for storing the logic generated in the preventing logic generating means 92, and 94 denotes preventing circuit inserting means for inserting the logic generated in the logic generating means 92 on the basis of the result of the bus check by the exclusiveness checking means 3 effecting the exclusiveness check between that bus and the bus control circuit and writing the circuit connection information in the circuit connection storing memory 90.

Figure 30:
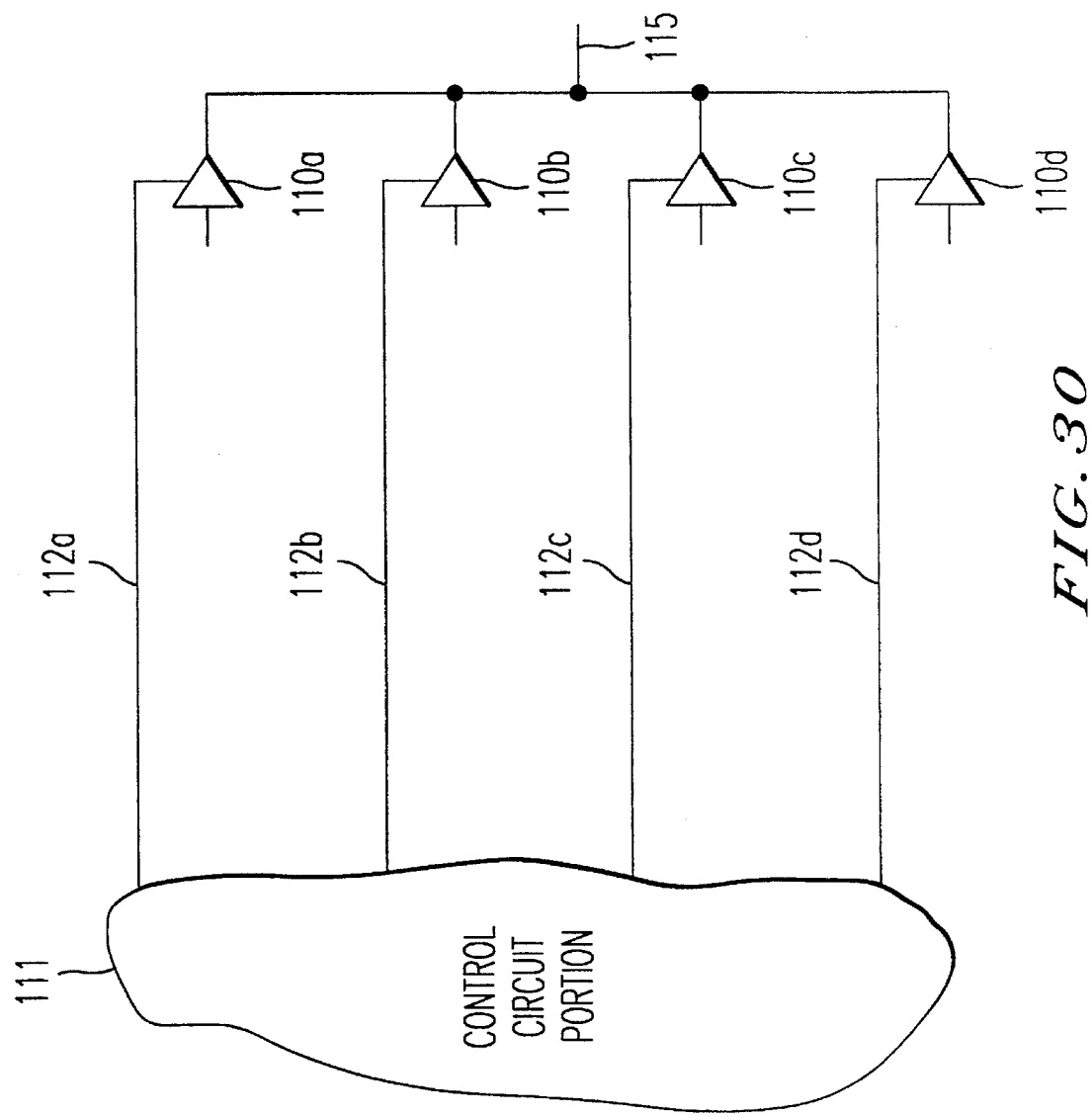
FIG. 30 is a logic diagram showing one example of a circuit which is an object of processing by the bus checking device according to the sixth preferred embodiment of the present invention.
Figure 31:
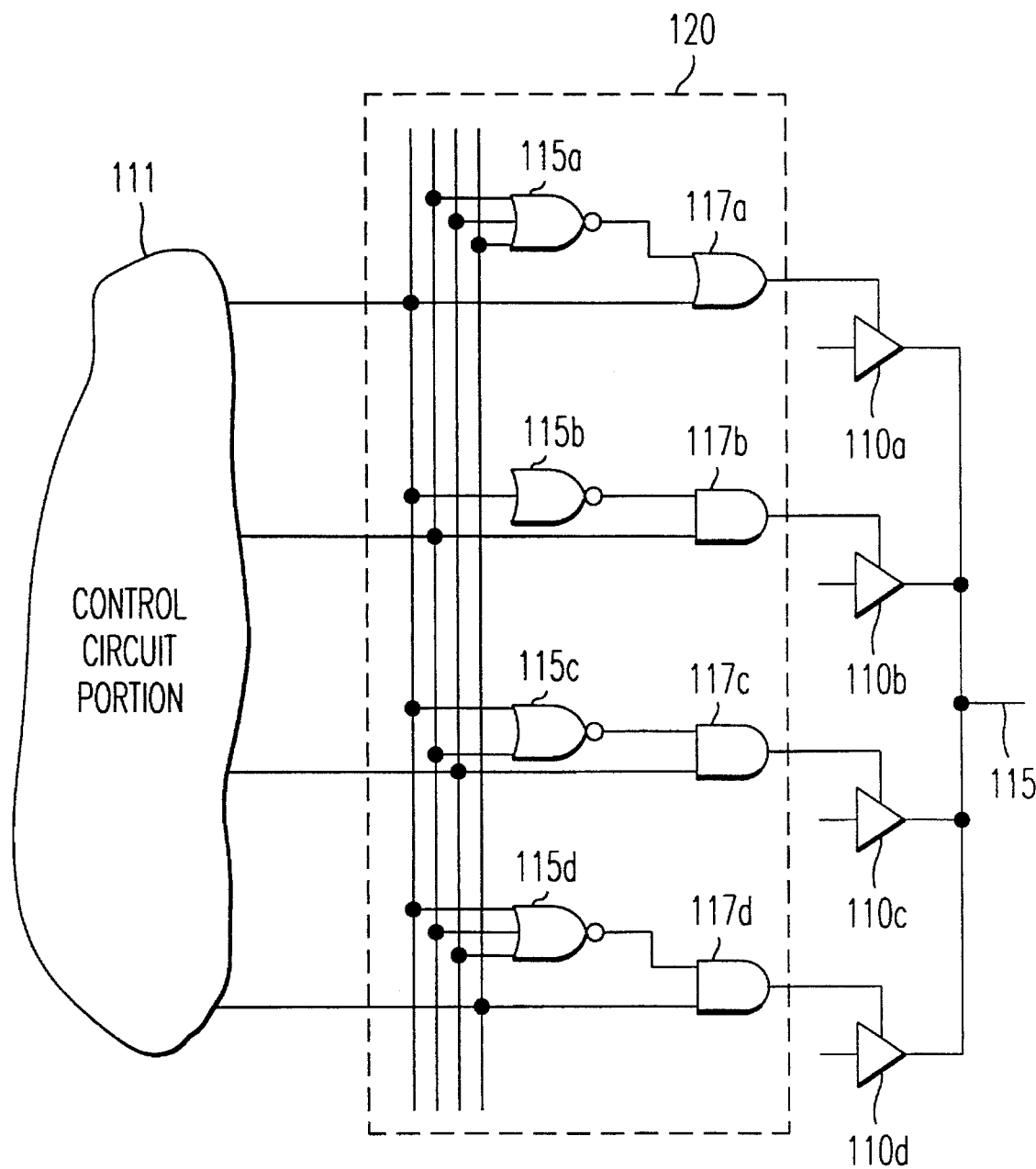
FIG. 31 is a logic diagram showing a circuit obtained after the bus checking device according to the sixth preferred embodiment has processed the circuit of FIG. 30.

Next, the operation of the bus checking device shown in FIG. 29 is described using FIG. 30 and FIG. 31. In FIG. 30, 111 denotes a control circuit portion, 110a–110d denote tri-state drivers controlled by the control circuit portion 111, 112a–12d denote bus control signal lines connected to control terminals of the tri-state drivers 110a–110d respectively for propagating control signals outputted from the control circuit portion 111 and 115 denotes a bus signal line connected to outputs of the tri-state drivers 110a–110d in common. In FIG. 31, 120 denotes a preventing logic circuit generated by the preventing logic generating means 92 and inserted by the preventing circuit inserting means 94, and reference characters the same as those in FIG. 30 denote the same parts as in FIG. 30.

If it is determined that outputs of the control circuit portion 111 are not exclusive in the exclusive checking means 3, the preventing logic generating means 92 first generates the logic shown in the circuit 120. The circuit 120 is a circuit for realizing a preventing logic for providing superiority and inferiority to the control signals outputted from the control circuit portion 111 so that signal conflict and floating on the bus will not occur.

The logic generated in the preventing logic generating means 92 is stored in the preventing logic storing memory 93. The preventing circuit inserting means 94 inserts the circuit 120 for realizing the preventing logic stored in the preventing logic storing memory between the tri-state drivers 110a–110d of the bus determined not to be exclusive by the exclusiveness checking means 3 and the control circuit portion 111 of that bus. The circuit with the preventing logic inserted is stored in the circuit connection storing memory 90 by the preventing circuit inserting means 94.

Now, the checked control circuit extracting means 2 may extract a control circuit portion using a net list having a preventing circuit inserted and the exclusiveness checking means 3 may check the exclusiveness of the bus. As the circuits are inserted only in places which are determined to have possibility of occurrence of signal conflict or floating on buses, the signal conflict and floating of the buses can be avoided efficiently.

Figure 32:
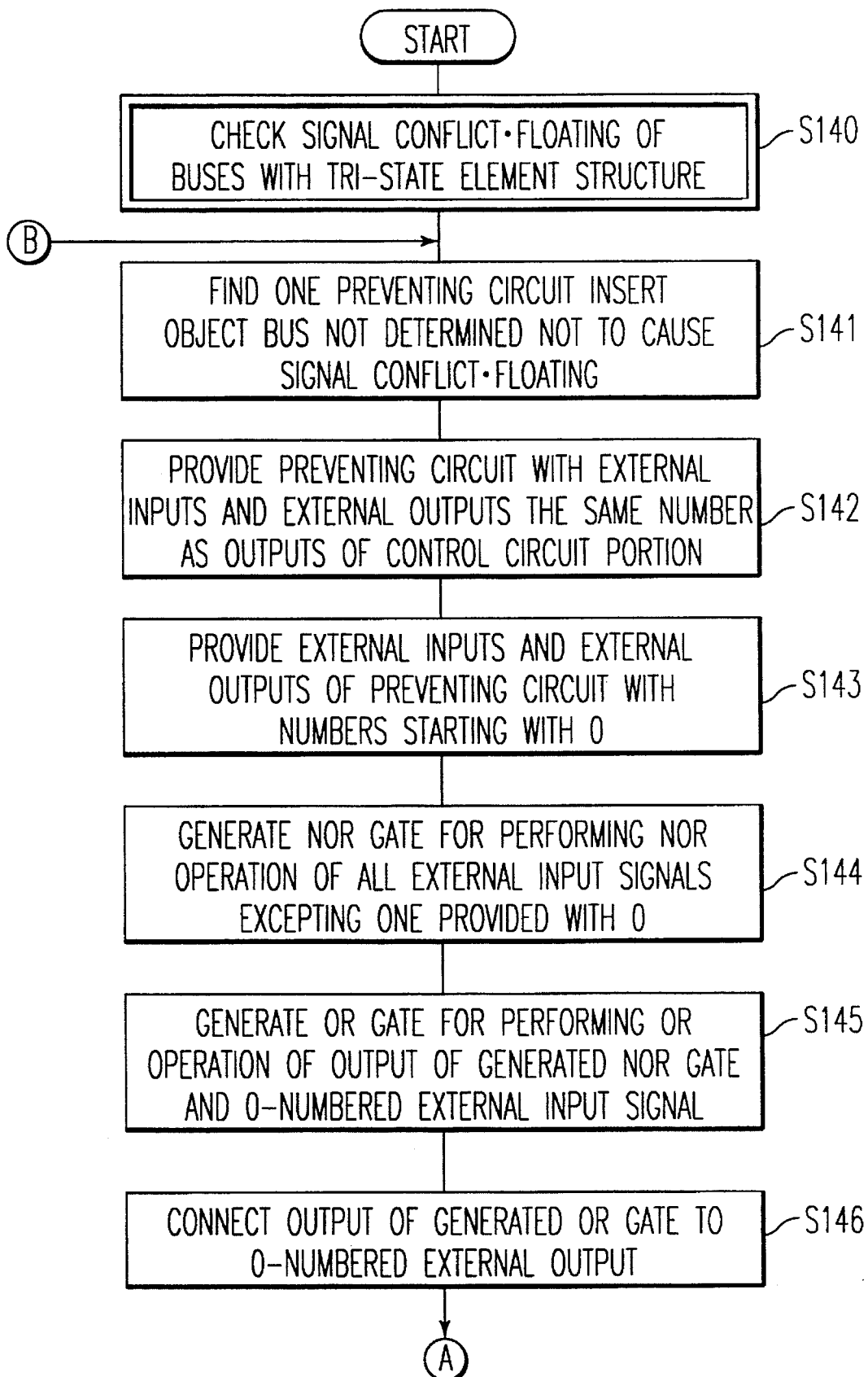
FIG. 32 is a flow chart showing one example of the procedure for realizing the bus checking method according to the sixth preferred embodiment of the present invention with a computer.
Figure 33:
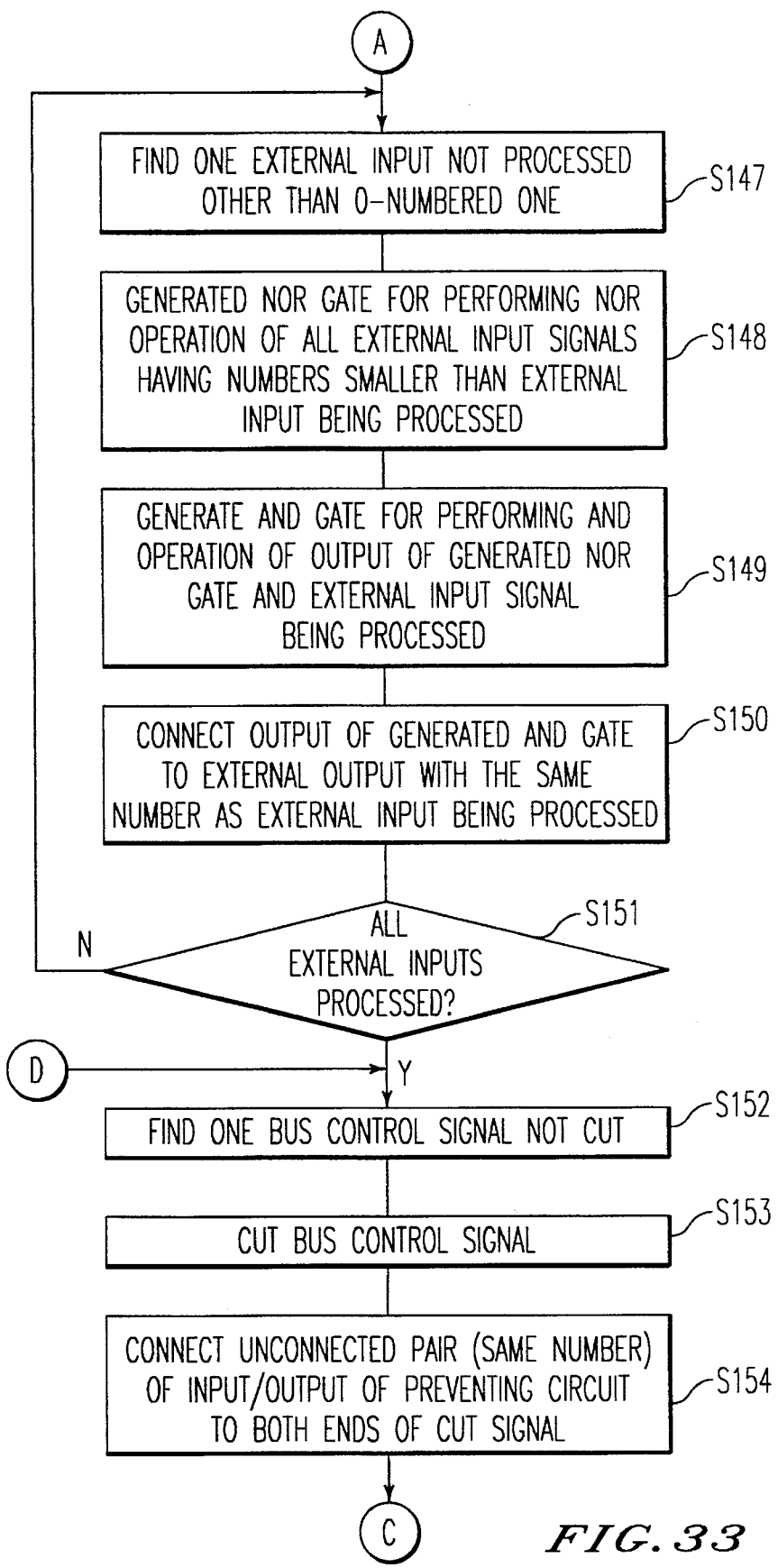
FIG. 33 is a flow chart showing one example of the procedure for realizing the bus checking method according to the sixth preferred embodiment of the present invention with a computer.
Figure 35:
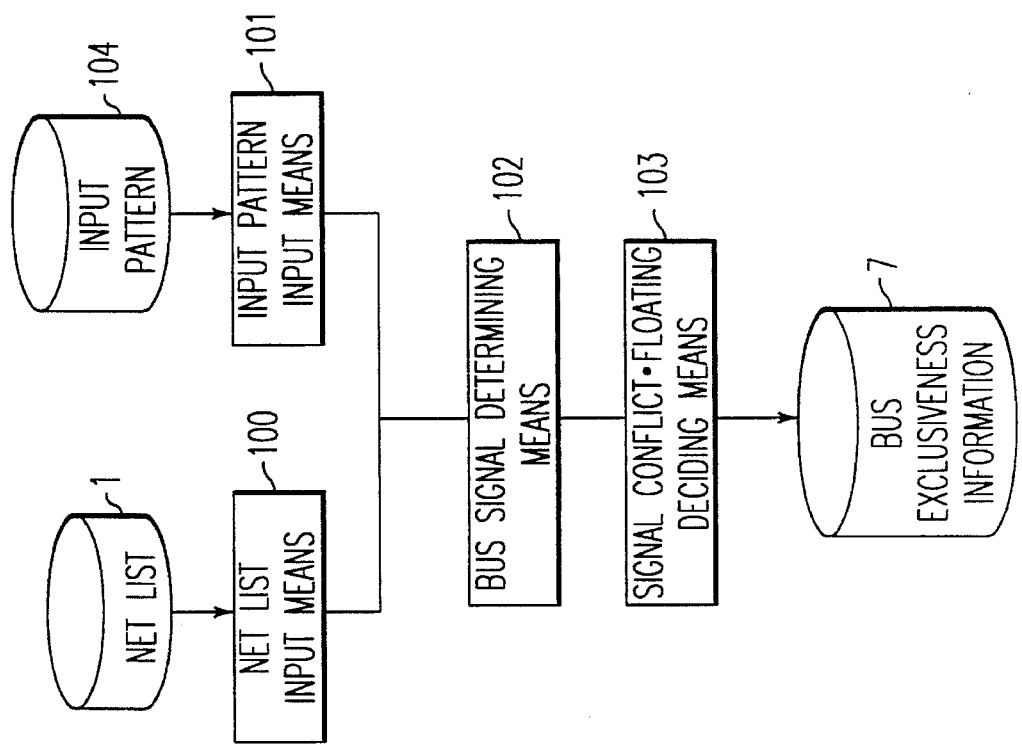
FIG. 35 is a block diagram showing the structure of a conventional bus checking device.
Figure 34:
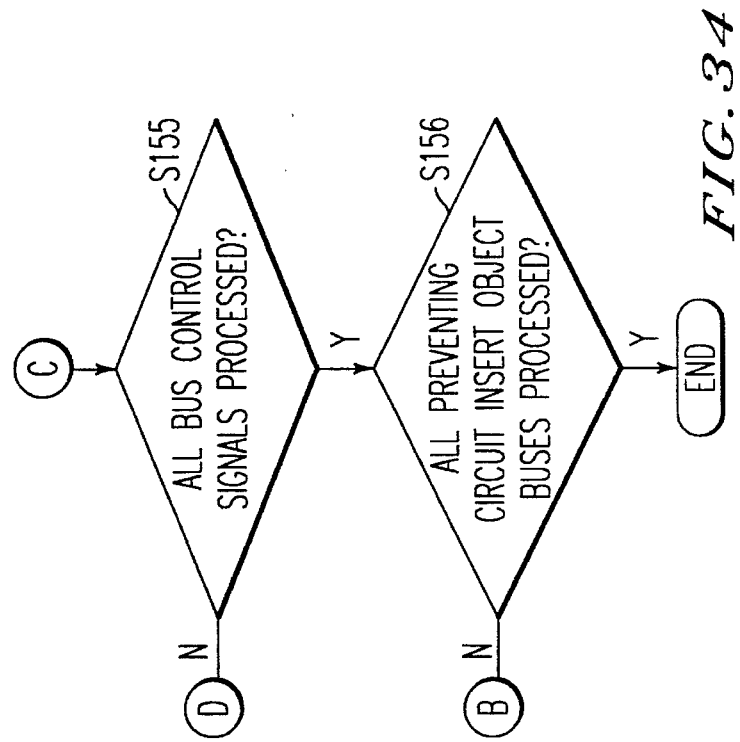
FIG. 34 is a flow chart showing one example of the procedure for realizing the bus checking method according to the sixth preferred embodiment of the present invention with a computer.
Figure 36:
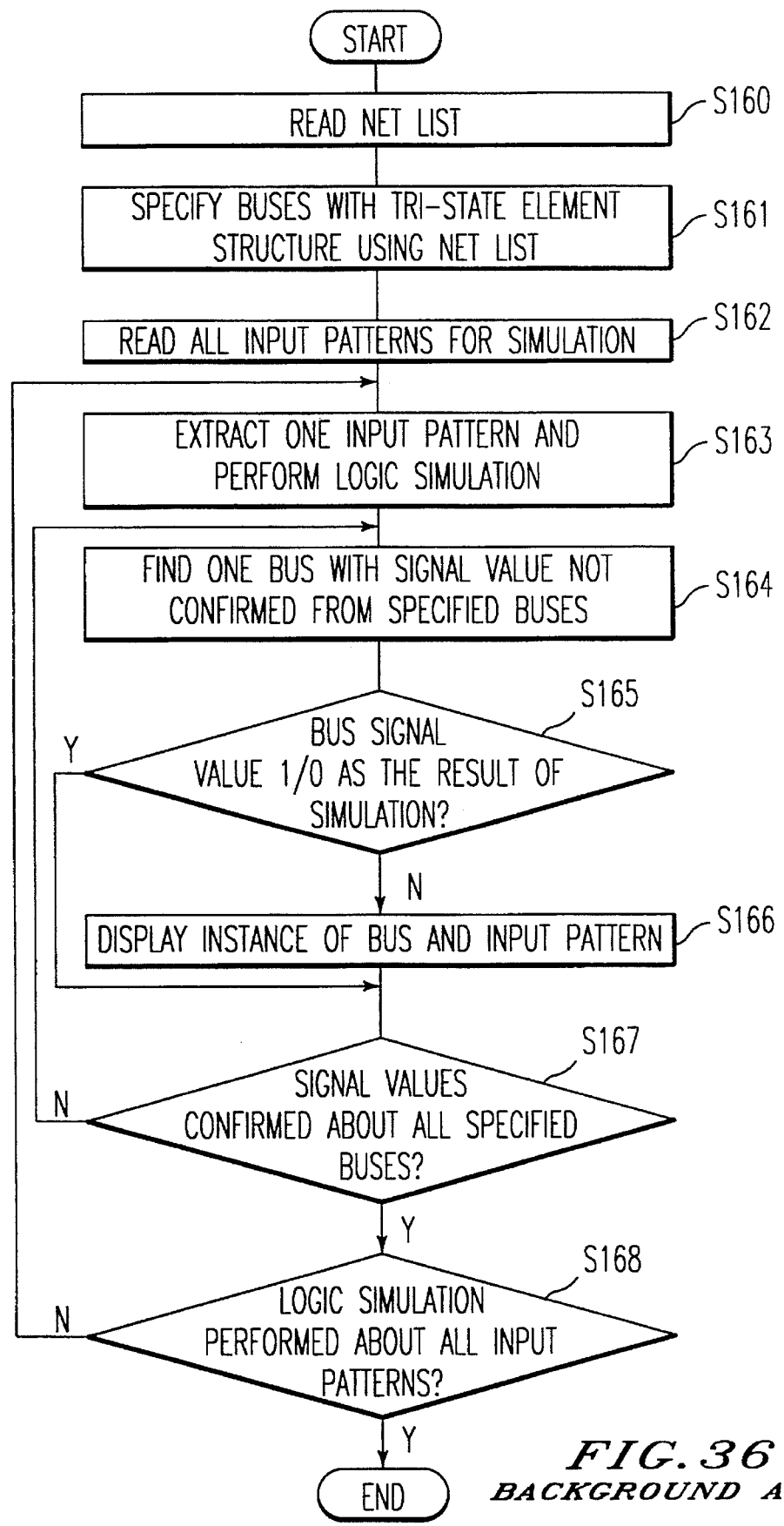
FIG. 36 is a flow chart showing the operation of the conventional bus checking device.

Next, the procedure of the case of realizing the above-described bus checking device using a computer will be described referring to FIGS. 32 through 34. It starts and first the signal conflict and floating of buses with the tri-state element structure is checked in the step S140. This process is a process of the exclusiveness check of buses done according to the procedure of the above-described first, second, third, fourth or fifth preferred embodiment.

In the step S141, one bus which could not be determined not to cause signal conflict or floating is found out and which is regarded as a preventing circuit insert object. In the step S142, external inputs and external outputs of the same number as the outputs of the control circuit portion are provided to the preventing circuit. In the step S143, the external inputs and the external outputs provided to the preventing circuit in the step S142 are numbered starting with 0, respectively.

In the step S144, a NOR gate for performing NOT-OR operation of all the external input signals other than the 0-numbered one of the preventing circuit is generated. In the step S145, an OR gate for performing OR operation of output of the NOR gate generated in the step S144 and the 0-numbered external input signal is generated. In the step S146, the output of the OR gate generated in the step S145 is connected to the 0th external output.

In the step S147, one unprocessed external input other than the 0th one is found out and the external input is regarded as an object of the processing. In the step S148, a NOR gate for performing NOT-OR operation of all the external input signals having numbers smaller than the external input found in the step S147 is generated. In the step S149, an AND gate is generated for performing AND operation of an output of the NOR gate generated in the step S148 and the external input signal being processed. In the step S150, the output of the AND gate generated in the step S149 is connected to the external output having the same number as the external input of the preventing circuit being processed.

In the step S151, a determination is made as to whether all the external inputs of the preventing circuit provided in the step S142 have been processed or not. If all of the external inputs of the preventing circuit have been processed, it goes to the step S152. If all of the external inputs have not been processed, it goes to the step S147.

In the step S152, one uncut bus control signal outputted from the control circuit portion is found. In the step S153, the bus control signal found in the step S152 is cut. In the step S154, input/output of an unconnected pair (the same number) of the preventing circuit are connected to both ends of the bus control signal which is cut in the step S153.

In the step S155, a determination is made as to whether all the bus control signals of the bus found in the step S141 have been processed or not. If all the bus control signals have not been processed, it proceeds to the step S152 from the step S155. If all of those bus control signals have been processed, it proceeds to the step S156 from the step S155.

In the step S156, a determination is made as to whether all the buses which have been determined to possibly cause bus collision or bus floating in the step S140 have been processed or not. If all of those buses have not been processed, it goes from the step S156 to the step S141. If all of those bus control signals have been processed, all the processes are ended.

Each of the above-described preferred embodiments can be combined to be used and the combinations of each preferred embodiment produce effects the same as each preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A bus checking device for checking a bus including tri-state elements on the basis of information about a designed circuit for signal conflict or floating of said bus with control signals outputted from a bus control circuit for controlling said bus, comprising:

checked control circuit extracting means for extracting a control circuit portion which is concerned in determination of said control signals from said information about said designed circuit according to a predetermined rule; and exclusiveness checking means for checking exclusiveness of said bus by checking exclusiveness of output signals of said control circuit portion extracted by said checked control circuit extracting means.

2. The bus checking device according to claim 1, wherein said checked control circuit extracting means comprises;

a function of extracting a wired portion from a net list in which said information about said designed circuit is described to specify a bus with tri-state element structure, a function of tracing logic gates until reaching external input terminals and/or storage elements in a direction opposite to a flow of a signal about control signals of said tri-state elements, and a function of extracting as a control circuit portion a circuit portion including said traced logic gates with said external input terminals and/or said storage elements as input terminals.

3. The bus checking device according to claim 2, wherein said exclusiveness checking means comprises;

determining means for determining signal values of output signals of said control circuit portion with respect to arbitrary input pattern applied to said control circuit portion, observing means for observing the signal values of said output signals determined by said determining means, and deciding means for deciding exclusiveness by recognizing the number of output signals which are at a predetermined value in said signal values of said output signals.

4. The bus checking device according to claim 2, wherein said exclusiveness checking means comprises;

determining means for obtaining output functions of said control circuit portion, observing means for selecting one signal of said output signals of said control circuit portion and performing AND operation of said output signal and NOT logics of other output signals, and deciding means for performing OR operation of output results of said observing means which are repeated about all said output signals to decide exclusiveness.

5. The bus checking device according to claim 3 or 4, further comprising:

branch signal detecting means for detecting all branch signals having a plurality of propagation destinations of signal using said information about said control circuit portion extracted by said checked control circuit extracting means; and logic gate eliminating means for specifying logic gates which are necessary for checking the output signals of said control circuit portion from all said branch signals and eliminating other logic gates of said control circuit portion.

6. The bus checking device according to claim 5, wherein said branch signal detecting means comprises branch signal extracting means for extracting all branch signals having a plurality of propagation destinations of signal from a net list in which said information about said control circuit portion is described, and said logic gate eliminating means comprises;

downstream tracing means for tracing the logic gates included in said control circuit portion toward a downstream stage until reaching the output signals of said control circuit portion in a flow of said branch signals extracted by said branch signal extracting means, and untraced logic eliminating means for eliminating untraced logic gates which are not traced by said downstream tracing means.

7. The bus checking device according to claim 6, further comprising:

bus signal determining means for determining a value of said bus signal from a signal connected to an external input fixed to a signal value at a power source or ground level and the power source or ground using said information about said designed circuit; and checked bus detecting means for checking said bus signal determined by said bus signal determining means to detect said bus with the tri-state structure which is not fixed to the signal at the power source or ground level as an object bus for the bus check.

8. The bus checking device according to claim 7, further comprising:

register detecting means for detecting registers in said bus control circuit which operate with free-running clocks using said information about said designed circuit; and buffer replacing means for replacing said detected registers with buffers.

9. The bus checking device according to claim 8, further comprising:

nested bus detecting means for detecting nested buses from said bus control circuit using said information about said designed circuit; and selector replacing means for replacing detected said nested buses with selectors of AND-OR structure.

10. The bus checking device according to claim 9, further comprising:

logic circuit generating means for generating a logic circuit for preventing occurrence of signal conflict or floating in said bus for said bus which is not determined to be exclusive in said exclusiveness checking means; and preventing logic circuit inserting means for inserting said logic circuit generated by said logic circuit generating means between said bus and said bus control circuit.

11. A bus checking method for checking a bus including tri-state elements on the basis of information about a designed circuit for signal conflict or floating of said bus with control signals outputted from a bus control circuit for controlling said bus, comprising:

a checked control circuit extracting step for extracting a control circuit portion which is concerned in determination of said control signals from said information about said designed circuit according to a predetermined rule; and an exclusiveness checking step for checking exclusiveness of said bus by checking output signals of said control circuit portion extracted in said checked control circuit extracting step.

12. The bus checking method according to claim 11, wherein said checked control circuit extracting step comprises;

a step of extracting a wired portion from a net list in which said information about said designed circuit is described to specify a bus with tri-state element structure, a step of tracing logic gates until reaching external input terminals and/or storage elements in a direction opposite to a flow of a signal about control signals of said tri-state elements, and a step of extracting as a control circuit portion a circuit portion including traced said logic gates with said external input terminals and/or said storage elements as input terminals.

13. The bus checking method according to claim 12, wherein said exclusiveness checking step comprises;

a determining step for determining signal values of output signals of said control circuit portion with respect to arbitrary input pattern applied to said control circuit portion, an observing step for observing the signal values of said output signals determined by said determining step, and a deciding step for deciding exclusiveness by recognizing the number of output signals which are at a predetermined value in said signal values of said output signals.

14. The bus checking method according to claim 12, wherein said exclusiveness checking step comprises;

a determining step for obtaining output functions of said control circuit portion, an observing step for selecting one signal of said output signals of said control circuit portion and performing AND operation of said output signal and NOT logics of other output signals, and a deciding step for performing OR operation of output results of said observing step which are repeated about all of said output signals to decide exclusiveness.

15. The bus checking method according to claim 14, further comprising:

a branch signal detecting step for detecting all branch signals having a plurality of propagation destinations of signal on the basis of said information about said control circuit portion extracted in said checked control circuit extracting step; and a logic gate eliminating step for specifying logic gates which are necessary for checking the output signals of said control circuit portion from all said branch signals and eliminating other logic gates of said control circuit portion.

16. The bus checking method according to claim 15, wherein said branch signal detecting step comprises a branch signal extracting step for extracting all branch signals having a plurality of propagation destinations of signal from a net list in which said information about said control circuit portion is described, and said logic gate eliminating step comprises;

a downstream tracing step for tracing the logic gates included in said control circuit portion toward a downstream stage until reaching the output signals of said control circuit portion in a flow of said branch signals extracted by said branch signal extracting step, and an untraced logic eliminating step for eliminating untraced logic gates which are not traced by said downstream tracing step.

17. The bus checking method according to claim 16, further comprising before said checked control circuit extracting step:

a bus signal determining step for determining a value of said bus signal from a signal connected to an external input fixed to a signal value at a power source or ground level and the power source or ground using said information about said designed circuit; and a bus detecting step for detecting said bus with the tri-state element which is not fixed to the signal at the power source or ground level as an object bus for the bus check using the value of the bus signal determined in said bus signal determining step.

18. The bus checking method according to claim 17, further comprising before said checked control circuit extracting step:

a register detecting step for detecting registers in said bus control circuit which operate with free-running clocks using said information about said designed circuit, and a buffer replacing step for replacing said detected registers with buffers.

19. The bus checking method according to claim 18, further comprising before said checked control circuit extracting step:

a nested bus detecting step for detecting nested buses in said bus control circuit using said information about said designed circuit; and a selector replacing step for replacing detected said nested buses with selectors of AND-OR structure.

20. The bus checking method according to claim 19, further comprising after said exclusiveness checking step:

a step for generating a logic circuit for preventing occurrence of signal conflict or floating in said bus for said bus which is not determined to be exclusive in said exclusiveness checking step; and a preventing logic circuit inserting step for inserting generated said logic circuit between said bus and said bus control circuit.

* * * * *